(12) United States Patent
Lu

(10) Patent No.: US 11,011,520 B2
(45) Date of Patent: May 18, 2021

(54) SEMICONDUCTOR DRAM CELL STRUCTURE HAVING LOW LEAKAGE CAPACITOR

(71) Applicant: Etron Technology, Inc., Hsinchu (TW)

(72) Inventor: Chao-Chun Lu, Taipei (TW)

(73) Assignees: Etron Technology, Inc., Hsinchu (TW); Invention And Collaboration Laboratory Pte. Ltd., Singapore (SG)

( * ) Notice: Subject to any disclaimer, the term of this patent is extended or adjusted under 35 U.S.C. 154(b) by 0 days.

(21) Appl. No.: 16/395,257

(22) Filed: Apr. 26, 2019

(65) Prior Publication Data
US 2020/0295009 A1 Sep. 17, 2020

Related U.S. Application Data

(60) Provisional application No. 62/828,485, filed on Apr. 3, 2019, provisional application No. 62/824,315, filed
(Continued)

(51) Int. Cl.
*H01L 27/108* (2006.01)
*H01L 29/08* (2006.01)
*H01L 49/02* (2006.01)
*H01L 21/02* (2006.01)
(Continued)

(52) U.S. Cl.
CPC .... *H01L 27/10829* (2013.01); *H01L 21/0262* (2013.01); *H01L 21/02532* (2013.01);
(Continued)

(58) Field of Classification Search
CPC ......... H01L 27/10832; H01L 27/10826; H01L 27/10858; H01L 27/10879; H01L 21/845; H01L 29/0649; H01L 29/04; H01L 27/1211; H01L 28/40; H01L 29/517; H01L 27/10829; H01L 27/10861; H01L 27/10867; H01L 21/02532;
(Continued)

(56) References Cited

U.S. PATENT DOCUMENTS 4,873,205 A * 10/1989 Critchlow ............. H01L 21/743
438/647
4,877,750 A * 10/1989 Okumura .......... H01L 29/66181
438/387
(Continued)

*Primary Examiner* — Nelson Garces
(74) *Attorney, Agent, or Firm* — Winston Hsu

(57) ABSTRACT

This invention discloses a DRAM cell includes an asymmetric transistor coupled to a capacitor. The asymmetric transistor includes a drain region extending upward from an isolator region; a gate region extends upward from a gate dielectric or the isolator; a source region of asymmetric transistor extends upward from a first portion of an isolating layer. The upward extending directions of the drain region, the gate region, and the source region are perpendicular or substantially perpendicular to an original silicon surface. Moreover, the capacitor is partially formed in a concave and the isolating layer is positioned in the concave. The capacitor extends upward from a second portion of the isolating layer. The upward extending directions of the upright portion of the capacitor electrode, the third portion of the insulating layer and the counter electrode are perpendicular or substantially perpendicular to the original silicon surface.

25 Claims, 30 Drawing Sheets

Related U.S. Application Data on Mar. 27, 2019, provisional application No. 62/818,753, filed on Mar. 15, 2019.

(51) Int. Cl.
*H01L 21/762* (2006.01)
*H01L 21/027* (2006.01)
*H01L 21/311* (2006.01)

(52) U.S. Cl.
CPC .. *H01L 21/02636* (2013.01); *H01L 21/76224* (2013.01); *H01L 27/1087* (2013.01); *H01L 27/10826* (2013.01); *H01L 27/10867* (2013.01); *H01L 27/10879* (2013.01); *H01L 28/60* (2013.01); *H01L 29/0847* (2013.01); *H01L 21/0273* (2013.01); *H01L 21/31111* (2013.01)

(58) Field of Classification Search
CPC ....... H01L 29/41783; H01L 21/823418; H01L 21/823814; H01L 21/76262; H01L 21/76278; H01L 21/76294; G06F 17/5068; G06F 17/5045

See application file for complete search history.

(56) References Cited

U.S. PATENT DOCUMENTS

| | | | |
|---|---|---|---|
| 5,874,757 A * | 2/1999 | Chao | .................. H01L 27/10829 257/301 |
| 2004/0184327 A1 | 9/2004 | Okuda | |
| 2019/0051641 A1 | 2/2019 | Lee | |

* cited by examiner

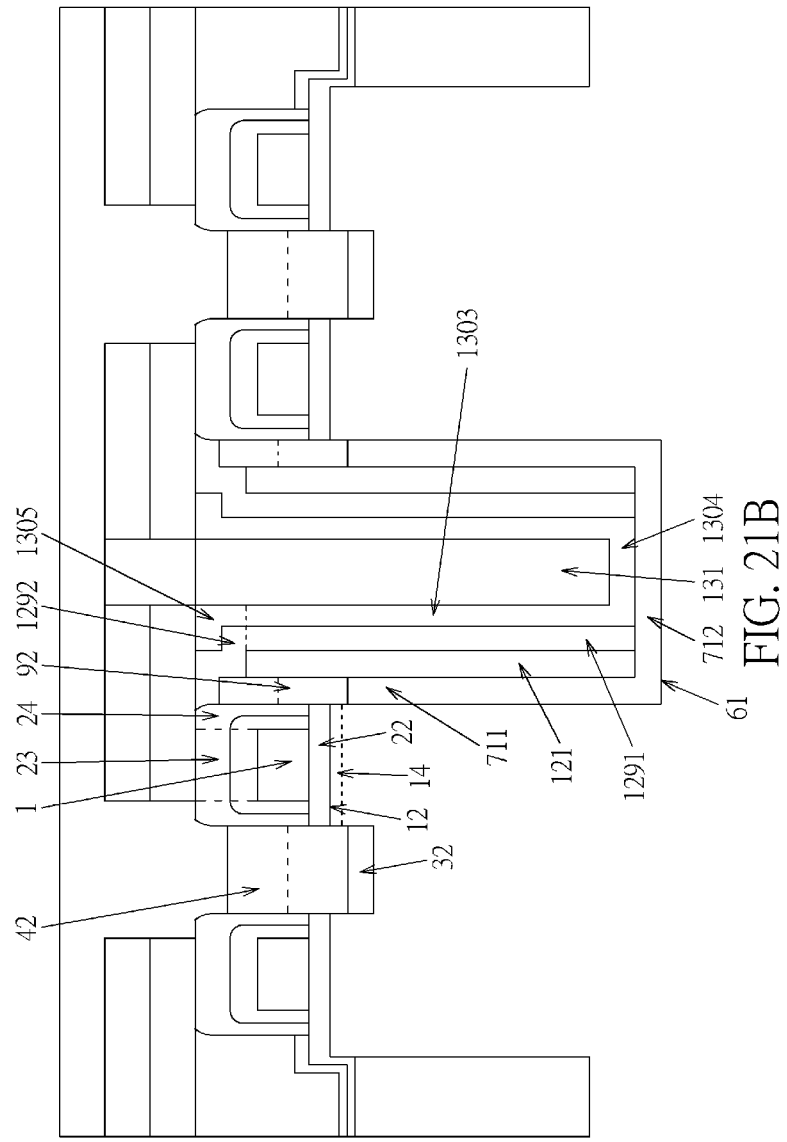

SEMICONDUCTOR DRAM CELL STRUCTURE HAVING LOW LEAKAGE CAPACITOR

CROSS REFERENCE TO RELATED APPLICATIONS

This application claims the benefit of U.S. Provisional Application No. 62/824,315, filed on Mar. 27, 2019, U.S. Provisional Application No. 62/818,753, filed on Mar. 15, 2019, and U.S. Provisional Application No. 62/828,485, filed on Apr. 3, 2019, the contents of which are incorporated herein by reference.

BACKGROUND OF THE INVENTION

1. Field of the Invention

The present invention relates to DRAM, and particularly to a DRAM cell having a transistor with three terminals which are self-aligned in parallel and having a capacitor with low leakage.

2. Description of the Prior Art

In order to make a microelectronics system, logic (or SOC—"System on Chip") function and memory (SRAM, DRAM, Flash NAND/NOR, etc.) functions need to be combined for effective and efficient execution, either on one silicon die or a combination of discrete chips. One of the most difficult challenges is how to transfer a large volume of data between logic circuit and DRAMs. There is a "DRAM Wall" which means that the data rate provided by DRAMs cannot catchup with the bandwidth that logic circuits demand. The difficulty is increasing as the process, transistor and interconnection system of logic circuit has been scaling much faster than the scaling of DRAMs. For example, the process node of each generation of logic circuit technology with transistors is approaching 5 nm from 7 nm, while the DRAM processing node is progressing much more slowly, from 20 nm to 15 nm. As a result, many problems—for example related to too many interfaces, power and thermal dissipation, and noise—are increasing harshly and lacking solutions.

Therefore, there is a need to provide effective DRAM cell which closely and optimally synchronizes both logic devices/circuits and DRAM cells/circuits.

SUMMARY OF THE INVENTION

The invention described herein is to create an effective DRAM cell which speeds up DRAM migration path between the logic circuit and DRAMs much easier and faster, just as logic technology migration follows Moore's Law demands. This invention also reduces technology/chip migration costs for both Logic and DRAM It maybe one object of the invention to provide a DRAM cell structure comprising a first conductive region extending upward and downward from a silicon surface, a gate structure above the silicon surface and extending upward from the silicon surface, a second conductive region extending upward and downward from the silicon surface, a channel region being under the gate structure and contacting with the first conductive region and the second conductive region, a concave formed below the silicon surface, an isolating layer positioned in the concave, wherein the isolation layer comprises a first portion covering a first sidewall of the concave and extending upward from a bottom wall of the concave, and a second portion covering a bottom surface of the concave, and a capacitor extending upward from the silicon surface and downward from the silicon surface to the second portion of the isolating layer. The upward extending directions of the first conductive region, the gate structure, and the second conductive region are perpendicular or substantially perpendicular to the silicon surface.

According to an aspect of the invention, the capacitor comprises a first electrode comprising a connecting portion contacting with the second conductive region and an upright portion extending upward from the second portion of the isolating layer, an insulating layer comprising a third portion extending upward from the second portion of the isolating layer and a fourth portion covering the second portion of the isolating layer, and a second electrode extending upward from the fourth portion of the insulating layer. Wherein, the insulating layer is positioned between the first and the second electrodes, and the upward extending directions of the upright portion of the first electrode, the third portion of the insulating layer and the second electrode are perpendicular or substantially perpendicular to the silicon surface. Moreover, the DRAM cell structure further comprises an isolator between the upright portion of the first electrode and the first portion of the isolating layer, wherein the top surface of the isolator is lower than that of the second conductive region, and the connecting portion of the first electrode cover the top surface of the isolator.

According to another aspect of the invention, the insulating layer further comprises fifth portion contacting with the connecting portion of the first electrode, wherein the top surfaces of the fifth portion of the insulating layer, the connecting portion of the first electrode, and the second electrode are not lower than the top surface of the gate structure. In addition, the top surfaces of the fifth portion of the insulating layer, the connecting portion of the first electrode, and the second electrode are aligned along a horizontal plane.

According to another aspect of the invention, the top surfaces of the first conductive region and the second conductive region are lower or not lower than the top surface of the gate structure. Further, the top surfaces of the first conductive region and the second conductive region are aligned along a horizontal plane.

According to another aspect of the invention, the top surface of the first conductive region is higher than the silicon surface, and the first conductive region extends downward from the silicon surface to a first isolator region. Moreover, the first conductive region includes a lower portion and an upper portion vertically stacked above the lower portion, and the lower portion contacts with the channel region and the first isolator region.

According to another aspect of the invention, the top surface of the second conductive region is higher than the silicon surface, and the second conductive region extends downward from the silicon surface to the first portion of the isolating layer. Besides, the second conductive region includes a lower portion and an upper portion vertically stacked above the lower portion, and the lower portion contacts with the channel region and the first portion of the isolating layer.

According to another aspect of the invention, the shape or size of the first conductive region is different from that of the second conductive region. According to another aspect of the invention, the DRAM cell structure further comprises a spacer being above the silicon surface and covering at least two sidewalls of the gate structure, wherein the first conductive region and the second conductive region contact with the spacer.

According to another aspect of the invention, the DRAM cell structure further comprises an isolator derived from the lower portion of the second conductive region and from the first portion of the isolating layer. Besides, the isolator comprises oxide material, the isolating layer comprises oxide material, and the second conductive region comprises silicon material.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 21B illustrates a cross-section view of the DRAM cell structure in FIG. 1B with additional description for most components thereof.

DETAILED DESCRIPTION

A detailed description of the hereinafter described embodiments of the disclosed apparatus and method is presented herein by way of exemplification and not limitation with reference to the Figures. Although certain embodiments are shown and described in detail, it should be understood that various changes and modifications may be made without departing from the scope of the appended claims. The scope of the present invention will in no way be limited to the number of constituting components, the materials thereof, the shapes thereof, the relative arrangement thereof, etc., and are disclosed simply as an example of embodiments of the present invention.

Figure 1A:
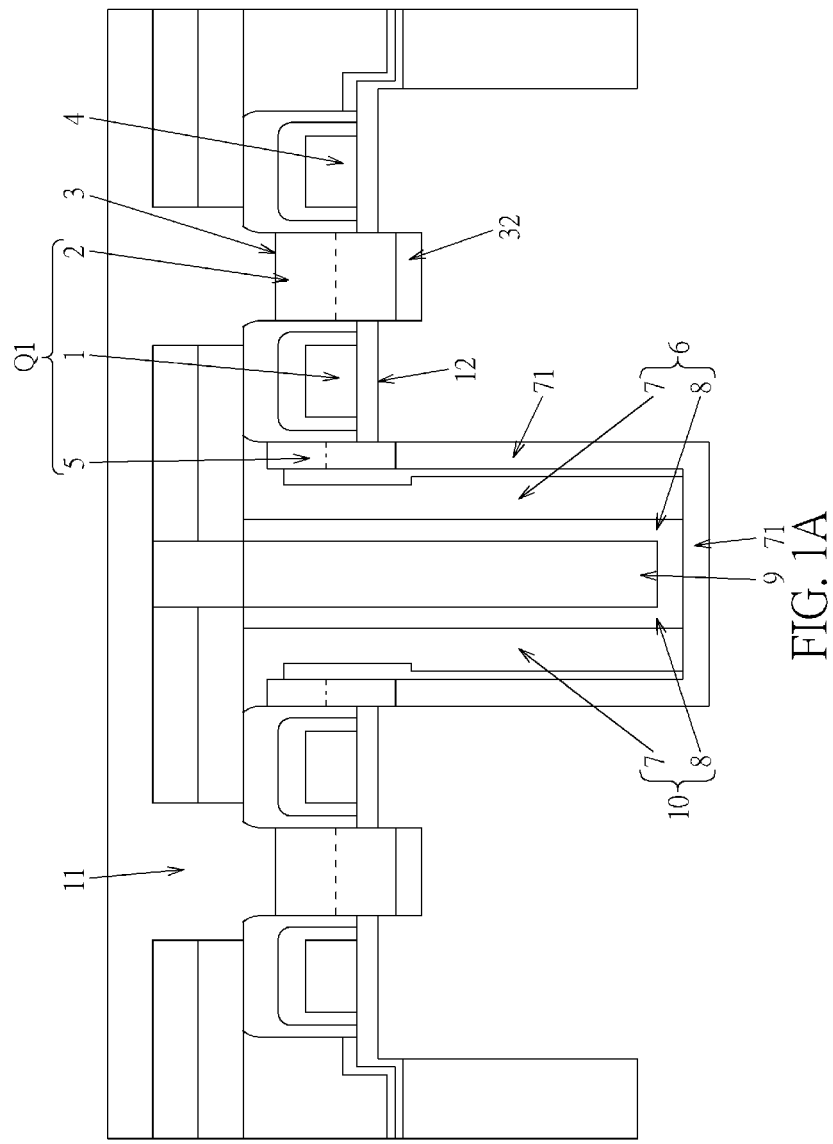
FIGS. 1A and 1B respectively illustrate a cross-section view of the proposed new DRAM cell structure.
Figure 1B:
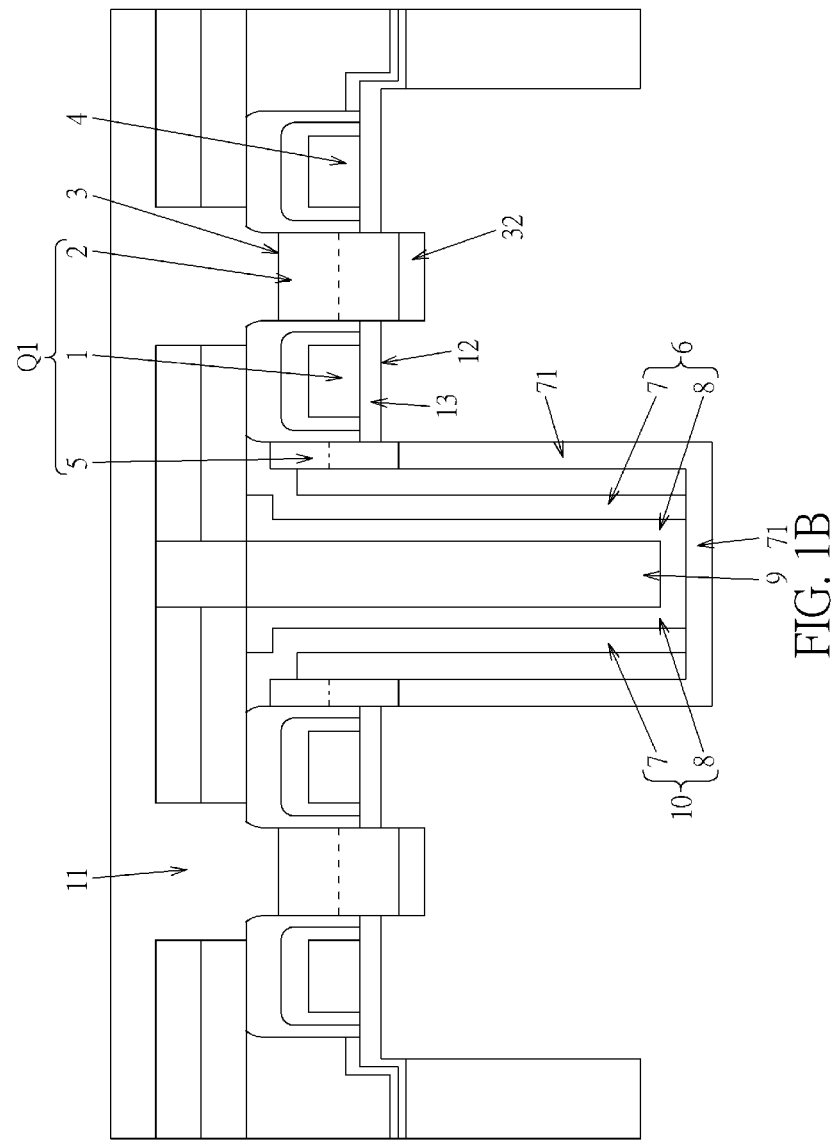

Please refer to FIG. 1A and FIG. 1B which show two invented DRAM cell structures, the invented DRAM cell structures (named as WU cell) by new well-designed silicon-integrated-circuit processing methods are introduced. This WU cell structure has one transistor Q1 with its drain region 2 used as a bit-line contact 3 shared with adjacent cell transistor 4 and its source region 5 connected with a capacitor 6, which has a storage-electrode pillar 7 insulated by a layer of high-k insulator 8 from a counter-electrode 9 shared with the neighboring cell-capacitor 10. A conductor line 11 (which can be metal, n+ doped polysilicon, polycide or the like) is connected to the open conductive region of the contacts 3 of the drain region 2. In one embodiment, the drain region is a vertical drain region which extends upward from an isolator region 32 and the top of the isolator region 32 is lower than the silicon surface 12. The source region 5 is a vertical source region which extends upward from an isolating layer 71 and the top of the isolating layer 71 is lower than the silicon surface 12. Moreover, the gate region 1 of the transistor Q1 also extends upward from the gate dielectric insulator and the gate region 1 is a kind of vertical gate. The storage-electrode pillar 7 has a vertical portion extending upward from the isolating layer 71 and the counter-electrode 9 is a vertical counter-electrode extending upward from the high-k insulator 8. The high-k insulator 8 also includes a vertical portion extending upward from the isolating layer 71. The silicon surface could be the silicon substrate surface when the transistor is a planar transistor, or could be the top surface of the fin structure when the new transistor is a FinFET or tri-gate transistor.

Therefore, the upward extending directions of the gate/drain/source regions are vertical or substantially vertical to the silicon surface 12. The upward extending directions of the vertical portions of the storage-electrode pillar 7/high-k insulator 8 are vertical or substantially vertical to the silicon surface 12 as well. Moreover, the upward extending direction of the counter-electrode 9 is also vertical or substantially vertical to the silicon surface 12. The geometry of the WU Cell is constructed as shown with a unique feature: (1) vertical drain region 2, (2) vertical gate region 1 (which can be of a FINFET, Tri-gate, planar transistor or the like), (3) vertical source region 5 connected with (4) the capacitor storage electrode 7 with a vertical portion, (5) high-k dielectric layer or insulator 8 with a vertical portion, and (6) vertical counter-electrode plate 9. The vertical drain portion 2, the vertical gate region 1, the vertical source region 5, the vertical portion of the capacitor storage electrode 7, the vertical portion of the high-k dielectric layer or insulator 8, and the vertical counter-electrode plate 9 are in parallel or substantially parallel.

As a result, the total size of the WU cell can be squeezed due to such a unique structure innovation, and the cell size is especially compacted by multiple self-alignment techniques used in between these vertical structures, resulting in a 1T1C memory cell with a very small form-factor. In addition, since the necessary connected regions of this WU Cell such as drain 2, gate 1, source 5, and counter-electrode-plate 9 are all raised higher than the original silicon surface 12, much more compact pitch (line width+space) rules of the necessary interconnections (metal lines or the like), which are used to connect those contact regions, can be achieved due to flatter surface topography.

One embodiment on how to make this WU cell is described in the following (e.g. a fin structure transistor, such as FinFET/Tri-gate transistor, is assumed to be used for the subsequent processes but other type of transistors such as planar transistor or the like can also be used likewise).

Figure 2A:
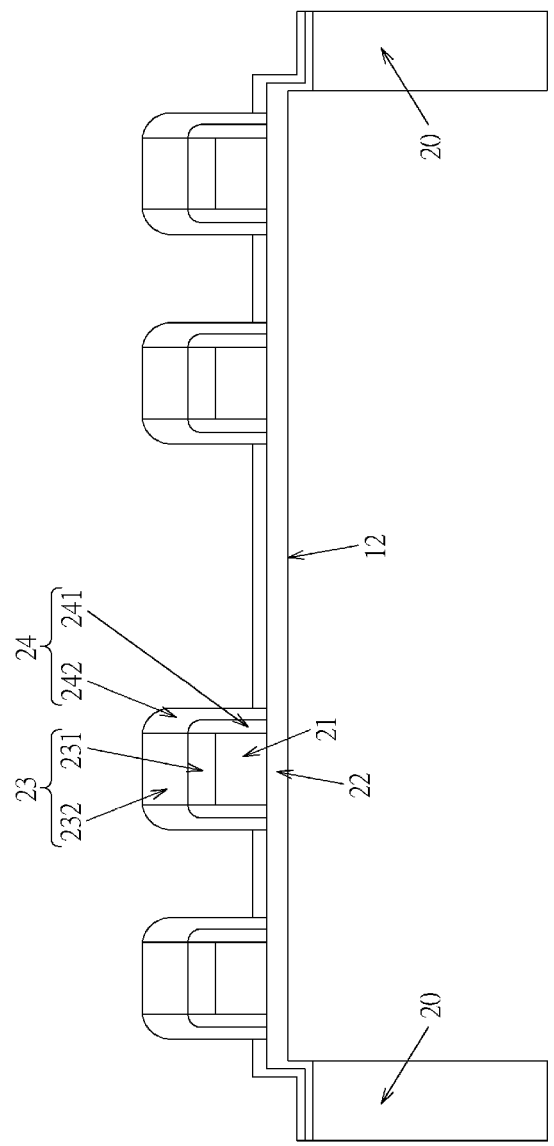
FIG. 2A illustrates a cross-section view following a first processing step with a transistor gate.
Figure 2B:
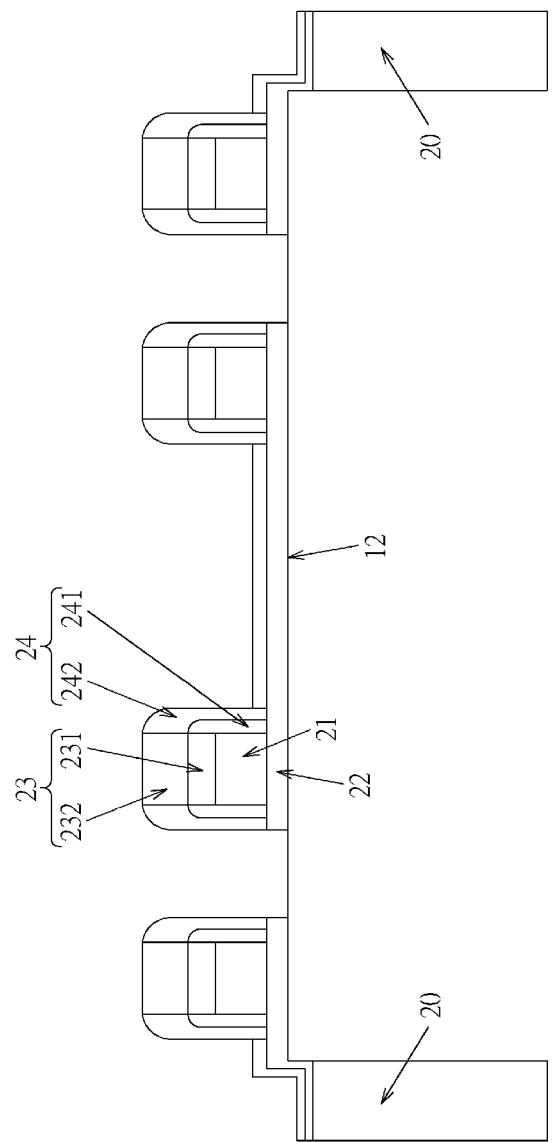
FIG. 2B illustrates a cross-section view following an etching step for remove an insulator on a drain region.

(a) Grow an Oxide-1 layer over a p-type silicon wafer substrate (which can also be the p-well of the triple-well or twin-well structure and the like). Then deposit a layer of Nitride-1. Then use photolithography method to define active regions for positioning future transistors being made. Outside these active regions, silicon material is etched away and use thermally grown oxide-2 region 20 (or deposited oxide and the like) to forma STI (shallow trench isolation) whose surface is about 25 to 30 nm below the silicon surface and the STI thickness can be another 500-2000 nm deeper into the silicon substrate. FIG. 2A shows the results: a gate region 21, an oxide-3 layer 22 underneath as gate-dielectric, a Cap-1 layer 23 (including nitride-4 layer 232/oxide-4 layer 231) on the top of the gate structure 21, and spacers 24 (including nitride-5 layer 242/oxide-5 layer 241) surrounding the gate region 21. The material of the spacer could be nitride, oxide, low dielectric constant material (such as k<3), or any combination thereof. The isolation regions (e.g. STI in FinFET or planar transistor, respectively) have been formed by following some common-practice well-known processing methods. Then use a photolithography process and an anisotropic etching process to remove the insulators (including the gate-dielectric 22) for the drain regions, as shown in FIG. 2B.

Figure 3A:
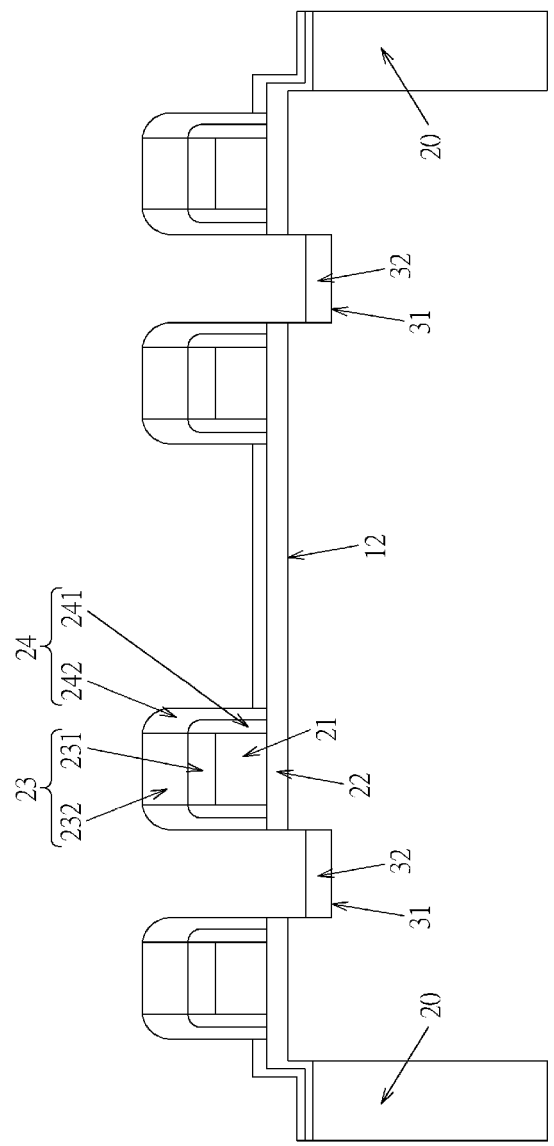
FIG. 3A illustrates a cross-section view following an etching step for making a concave at the drain region and a forming step for an isolation layer inside the concave.

(b) Use an anisotropic etching method to dig away the exposed silicon material in the active region to form concave-1 regions 31, and the depth of those concave-1 regions 31 can be deeper than the surface of the STI 20 (about 20 nm deep from the silicon surface), such as in a 25 nm or 30 nm depth. Then deposit a thick oxide-6 layer 32 to fill the concave-1 regions 31 and use the etch-back technique to ensure that part of oxide-6 layer 32 remains inside the concave-1 regions 31, as shown in FIG. 3A. The top of the remained oxide-6 layer 32 is lower than the silicon surface 12, and the remained oxide-6 layer 32 is an isolator region.

Figure 4A:
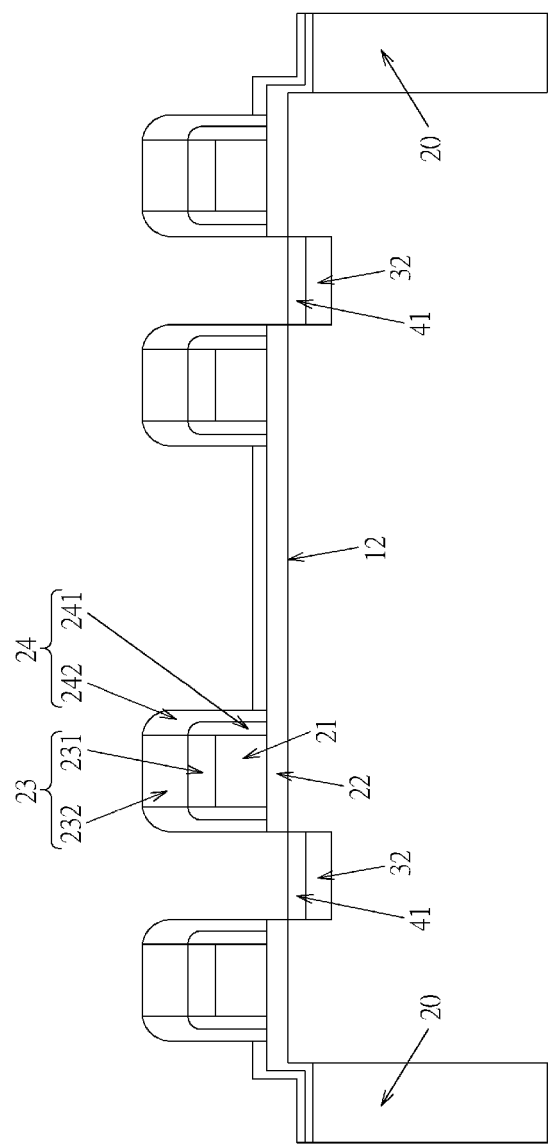
FIG. 4A illustrates a cross-section view following a forming step for a silicon layer over the isolation layer inside the concave according to FIG. 3A.
Figure 4B:
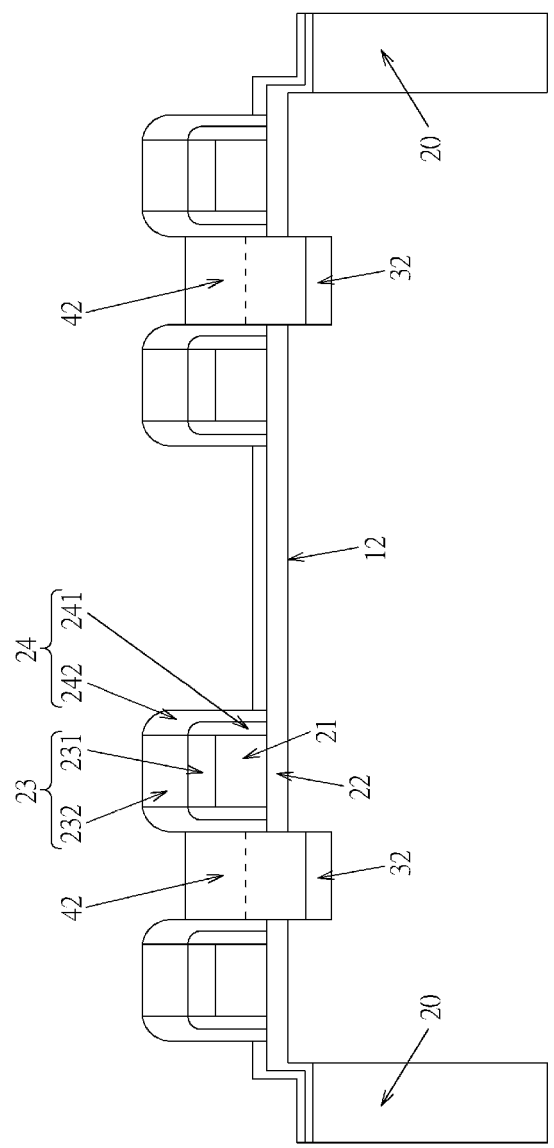
FIG. 4B illustrates a cross-section view following a forming step for a vertical drain regions (VTD).

(c) Then either a SEG (Selective Epitaxy Growth) or an ALD (atomic Layer Deposition) technique is used to grow from the exposed silicon on sidewalls of the concave-1 regions 31 as single-crystalline seeds for achieving a layer of silicon containing material 41 (such as silicon, SiC, or SiGe) over the oxide-6 layer 32 inside the concave-1 regions 31 (FIG. 4A). This SEG or ALD process could be continued with a growing height and some controlled doping concentration in this vertically formed drain regions 42, as shown in FIG. 4B. Those vertical drain regions 42 could be named as VTD (Vertical Tiering Drain).

Figure 5A:
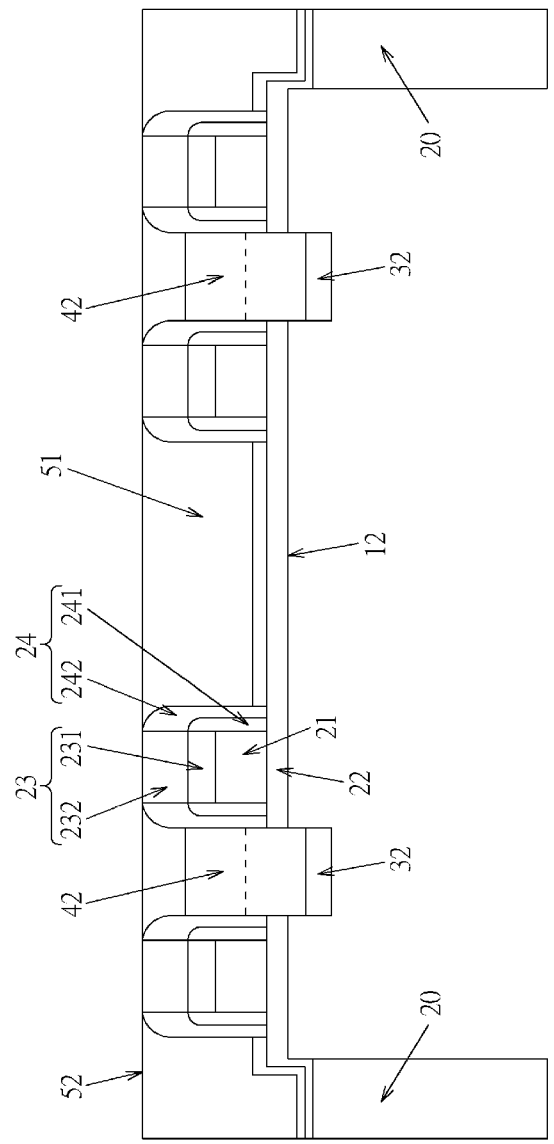
FIG. 5A illustrates a cross-section view following a forming step for a flat silicon surface.
Figure 5B:
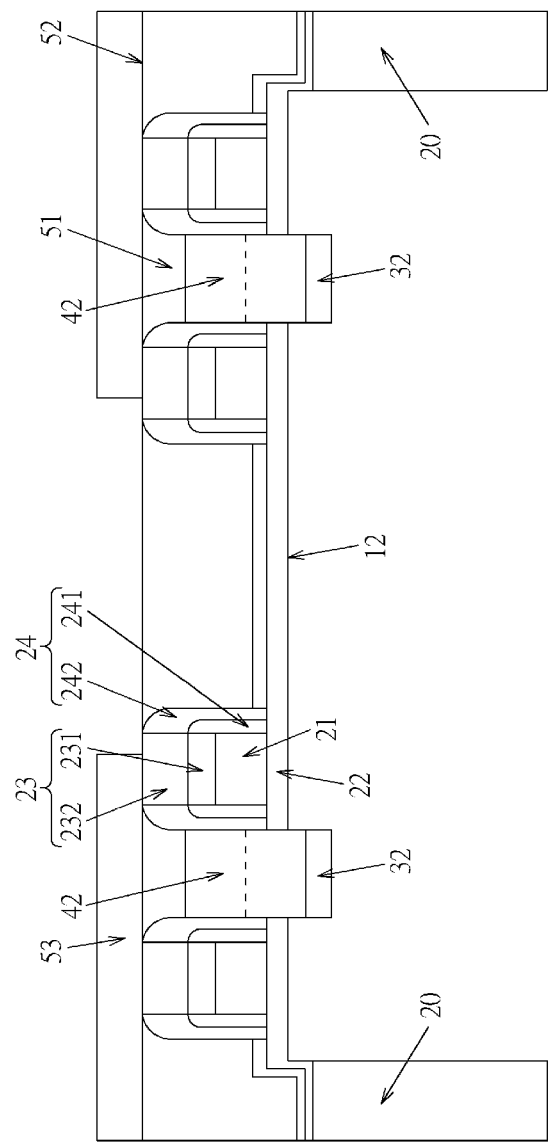
FIG. 5B illustrates a cross-section view following a photolithography patterning step for subsequent capacitor formation.

(d) Then an oxide-7 layer 51 is deposited and then etched back to assure that a flat silicon surface is achieved (called reference surface 52 in contrast to the original silicon surface 12), as shown in FIG. 5A. Then a photolithography is carried out to create patterns of photoresist 53 for the subsequent capacitor formation, as shown in FIG. 5B.

Figure 6A:
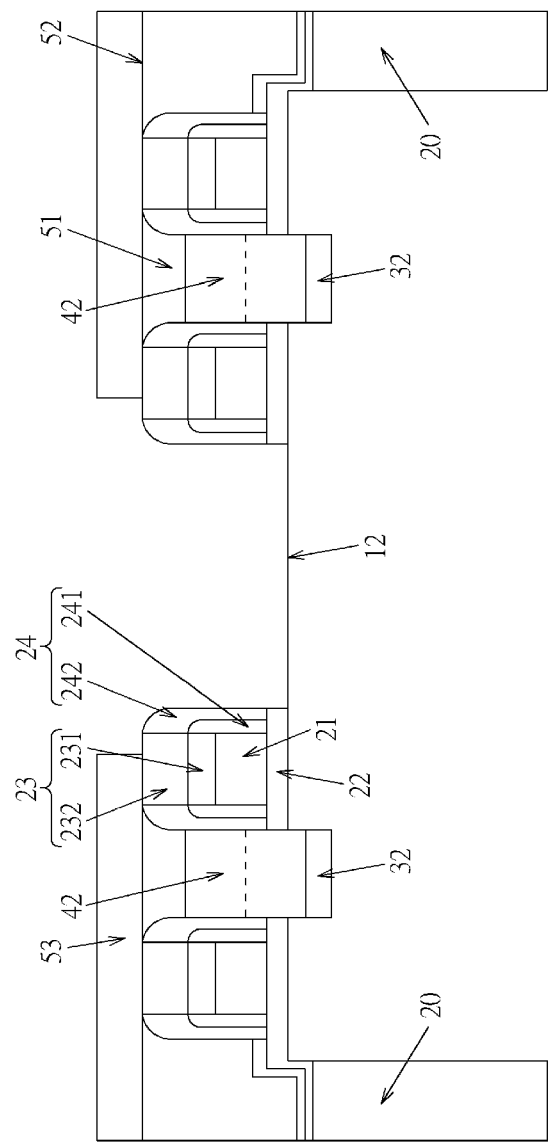
FIG. 6A illustrates a cross-section view following an etching step for removing materials in a capacitor region.
Figure 6B:
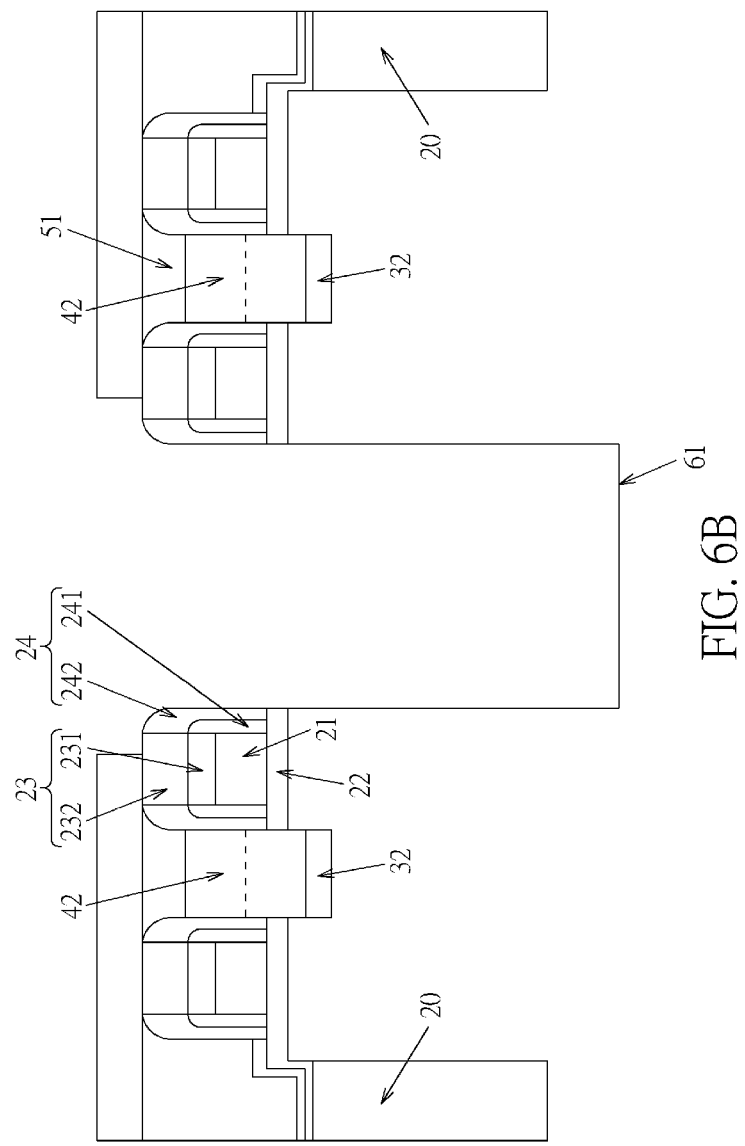
FIG. 6B illustrates a cross-section view following an etching step for making a concave at the capacitor region.

(e) FIG. 6A then shows that portion of oxide-7 layer 51 is removed in the capacitor region, and both part of the nitride-5 layer 242 and part of the oxide-3 layer 22 are removed as well. Then an anisotropic etching method is used to create another concave-2 region 61 which will be used as one part of the future-formed capacitors, as shown in FIG. 6B.

Figure 7:
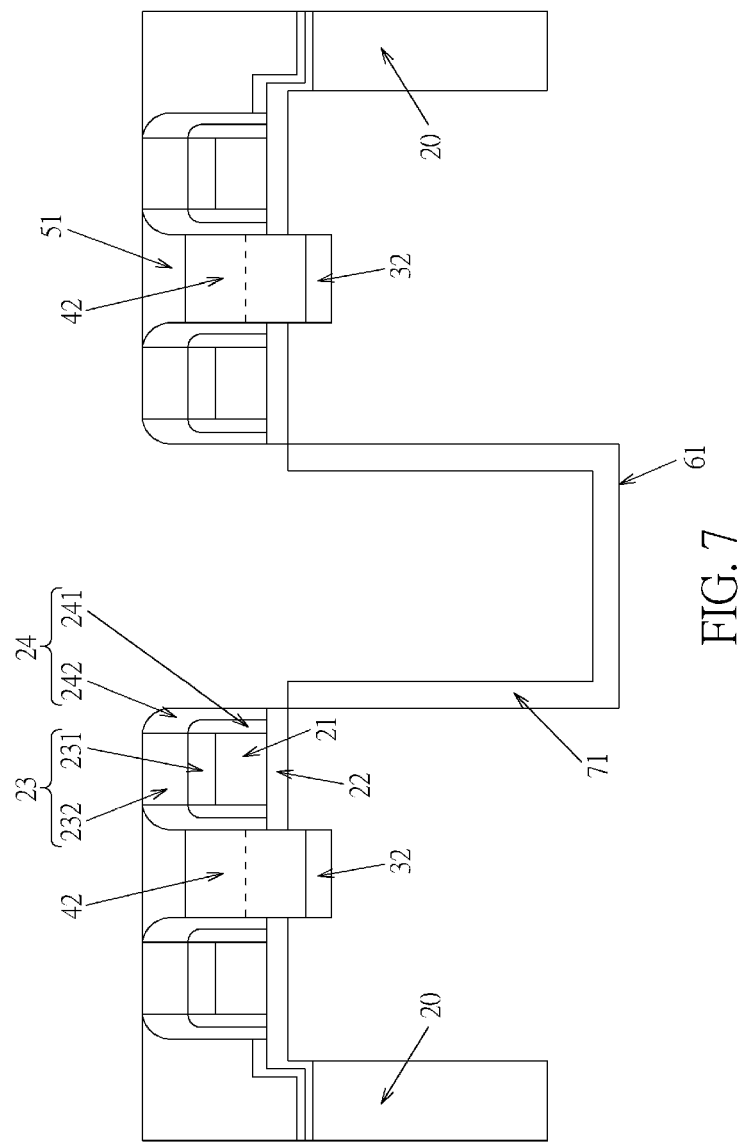
FIG. 7 illustrates a cross-section view following a forming step for an oxide layer surrounding the four sidewalls and the bottom surface of the concave at the capacitor region.

(f) Furthermore, strip the photoresist 53 and form the oxide-8 isolating layer 71 surrounding the sidewalls and the bottom surface of the concave-2 region 61 (it can be done by either a thermal growth method of a thin oxide-8 layer 71 or by depositing dense oxide-8 layer 71), and then use the SOG (Spin on Glass) material to protect both the four sidewalls and the bottom surface of oxide-8 on top of it, and use other techniques to remove SOG to create the concave-2 region 61 with oxide-8 isolating layer 71 structure shown in FIG. 7.

Figure 8:
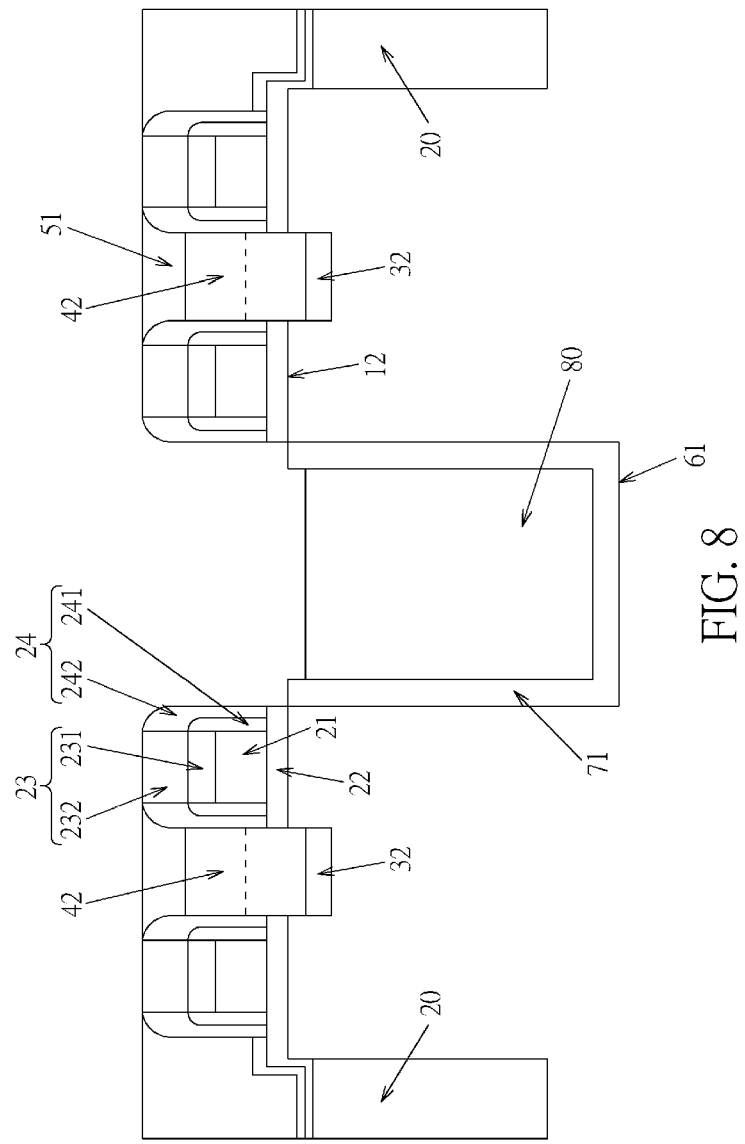
FIG. 8 illustrates a cross-section view following a forming step for filling an SOG layer in the concave at the capacitor region with a designed height.
Figure 9:
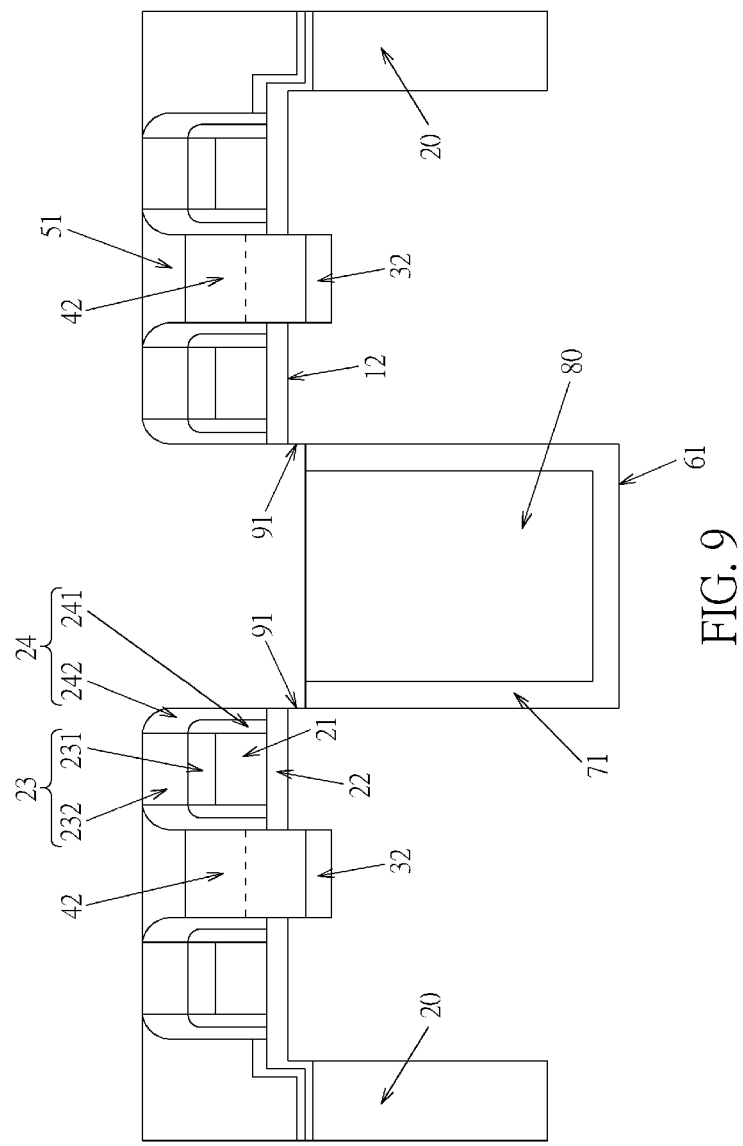
FIG. 9 illustrates a cross-section view following an etching step for removing the exposed oxide layer on top of the concave at the capacitor region.

(g) Then deposit a thick SOG layer 80 and use etch-back technique to leave the SOG material 80 filling in the concave-2 region 61 with a designed height to be lower than the original silicon surface 12, as portrayed in FIG. 8. Furthermore, use an etching (can be either anisotropic or isotropic way) method to remove the exposed oxide-8 layer 71 on top of the edge of the concave-2 region 61, but ensure it is not deeper than the height of SOG defined surface level. There is exposed silicon 91 on the top sidewalls of the concave-2 region 61, as shown in FIG. 9.

Figure 10:
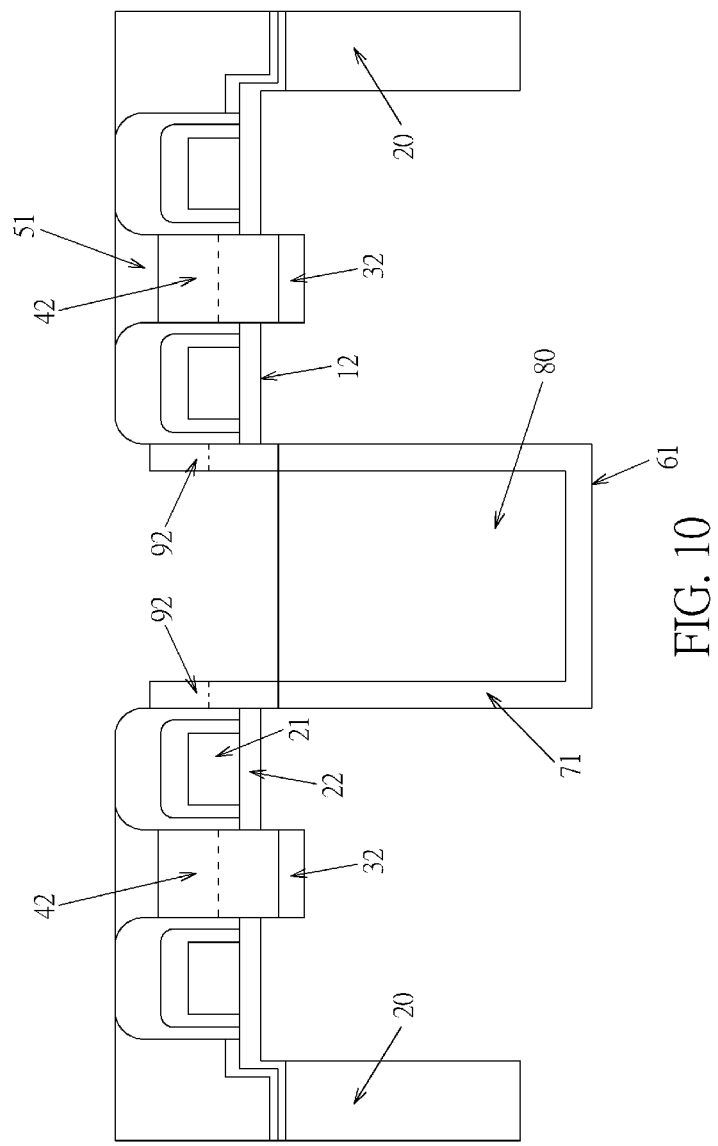
FIG. 10 illustrates a cross-section view following a forming step for a vertical source region (VTS).
Figure 11:
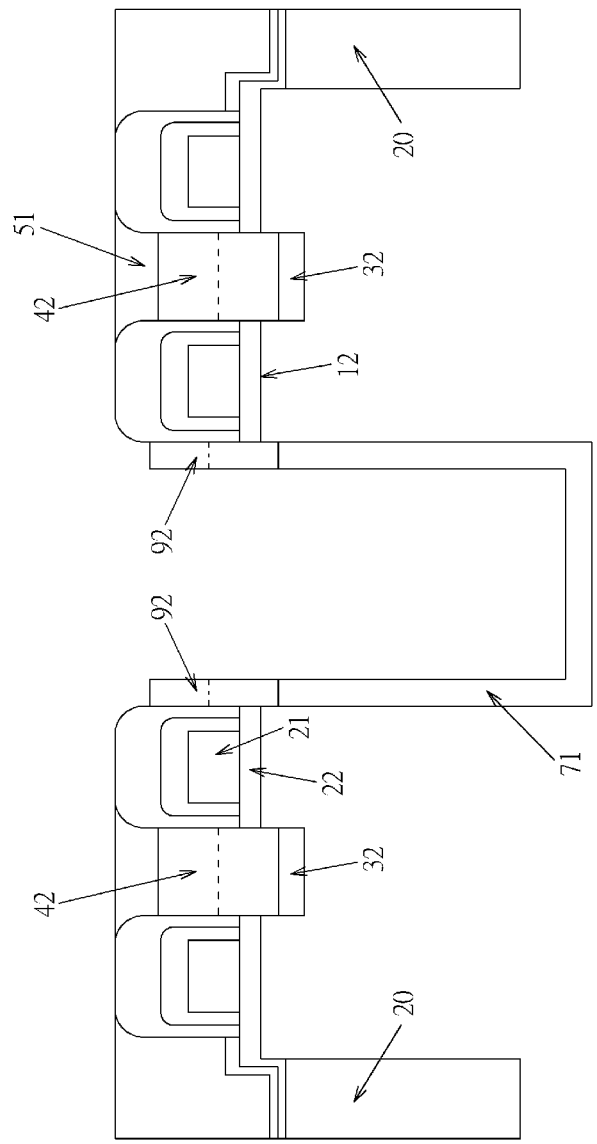
FIG. 11 illustrates a cross-section view following a step for removing the SOG material from the concave at the capacitor region.

(h) Then by using the exposed silicon 91 as the single-crystalline seeding area, a vertical source region along the transistor's source-edge can be grown with some selective doping concentration by either SEG or ALD technique. The grown source region could be silicon contacting material, such as polysilicon, SiC or SiGe. This vertical source region 92 is named as VTS (Vertical Tiering Source), which can be just lightly doped, or for more sophisticated need and design this vertical source pillar region 92 can have various doping concentration profiles). If necessary, then a laser annealing method with a very short period of time (or rapid thermal annealing or any other re-crystallization technique) can be used and applied to the wafer to achieve a high material quality of vertical diffusion areas including the SEG (or ALD) source regions 92/drain regions 42 (FIG. 10). FIG. 11 shows that the SOG material can be removed from the concave-2 region 61. In another example, it is possible to form the vertical drain region 42 and vertical source regions 92 simultaneously based on similar processes shown in FIGS. 2b, 3a, 4a, and 4b. In such situation, the top surfaces of the vertical source regions and the vertical drain regions could be aligned.

Figure 12A:
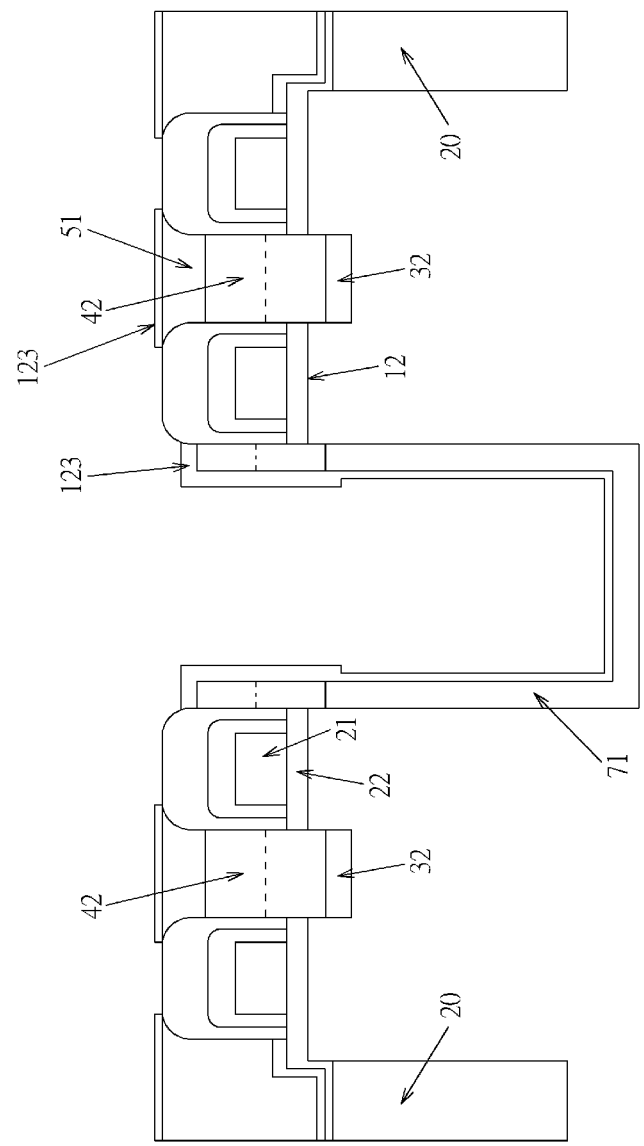
FIG. 12A illustrates a cross-section view following a forming step for growing an oxide layer to wrap the VTS and the oxide layer surrounding the four sidewalls and the bottom surface of the concave at the capacitor region according to a second embodiment of the present invention.
Figure 13A:
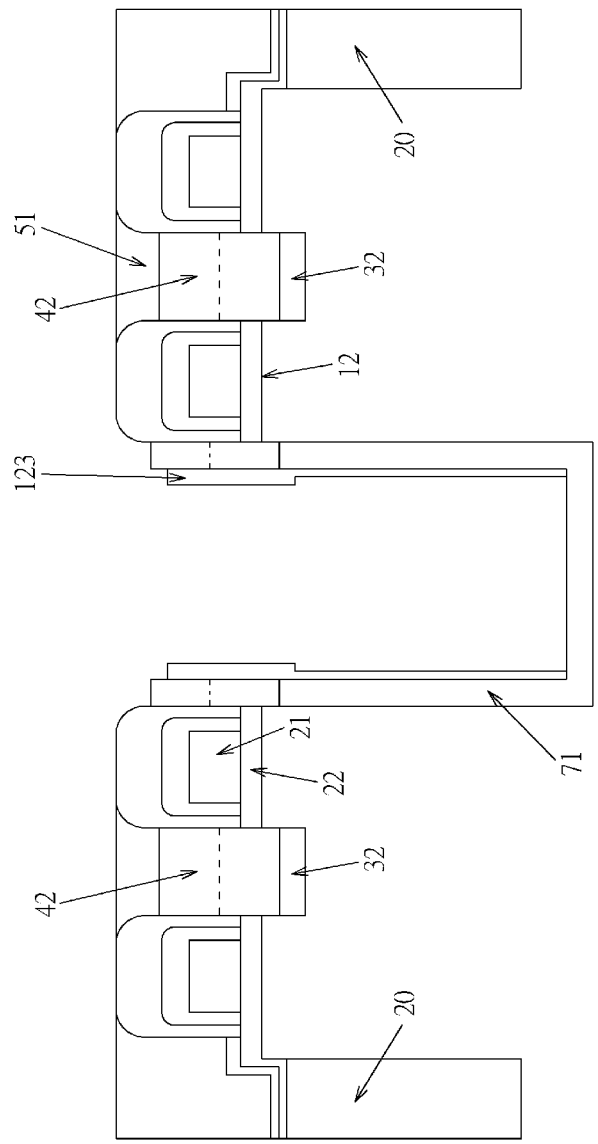
FIG. 13A illustrates a cross-section view following an etching step for exposing the top silicon area of the VTS according to FIG. 12A.
Figure 14A:
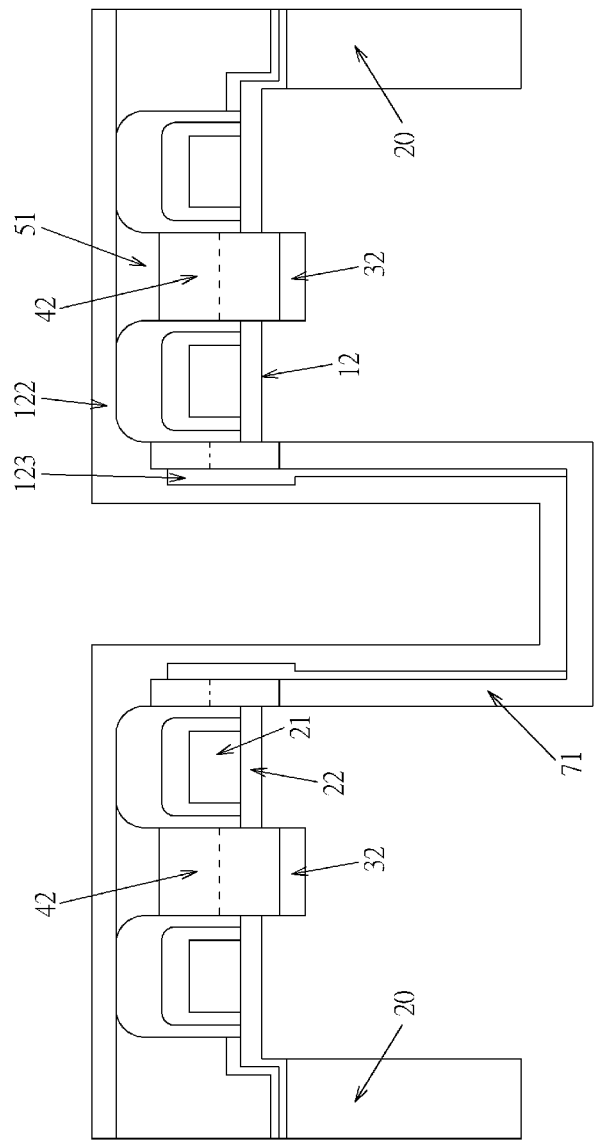
FIG. 14A illustrates a cross-section view following a forming step for a metal layer having a connection on the top exposed VTS area according to FIG. 13A.

(i) Then an insulating layer will be provided to cover portion of VTS source regions 92, such that a top portion of the VTS source regions 92 will be revealed. This could be done by two options:

1. One way of wrapping the VTS source pillar 92 and the oxide-8 layer 71 is to grow a thin oxide-9 layer ("covering isolator") 123 covering the VTS source pillar 92 and the oxide-8 layer 71 (FIG. 12A). In such situation, this thin oxide-9 layer 123 could be a thermal oxide layer grown from (or derived from) the VTS source pillar 92 and the oxide-8 layer 71. Then use an anisotropic etch technique to remove a portion of the oxide-9 layer 123 on the top surface of the wrapped VTS source pillar 92 to expose the top silicon area of the VTS source pillar 92 as shown in FIG. 13A. Then the metal layer 122 is deposited so that this metal layer 122 has a connection on the top exposed VTS source pillar 92 but is fully isolated from the outside silicon substrate of the concave-2 region 61 by oxide-8 layer 71 (FIG. 14A).

Figure 12B:
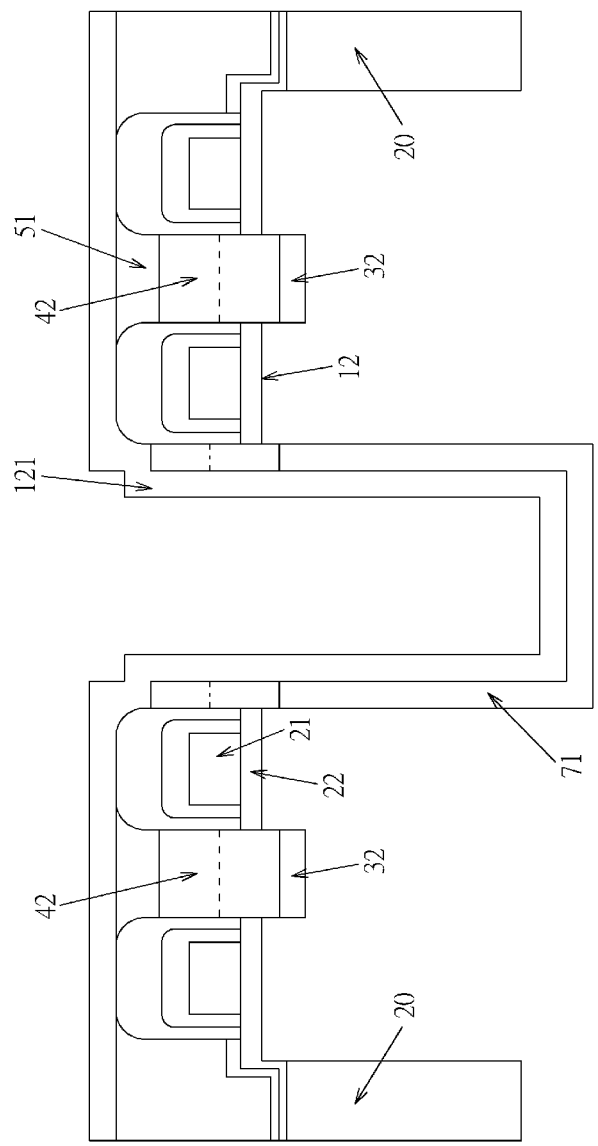
FIG. 12B illustrates a cross-section view following a forming step for depositing a nitride layer to wrap the VTS and the oxide layer surrounding the four sidewalls and the bottom surface of the concave at the capacitor region according to a first embodiment of the present invention.
Figure 13B:
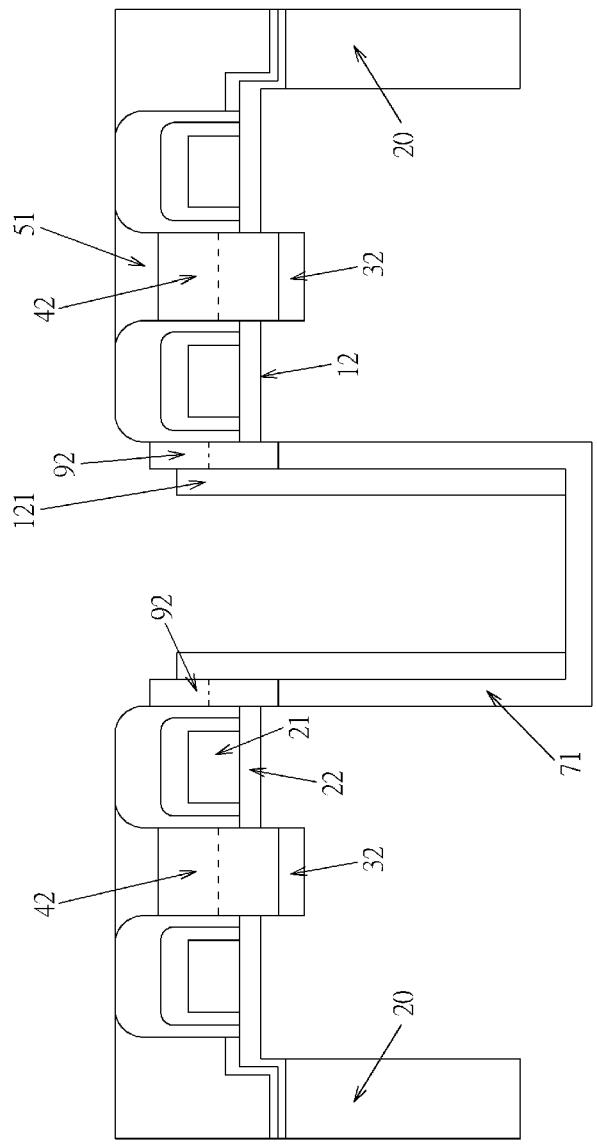
FIG. 13B illustrates a cross-section view following an etching step for leaving a nitride spacer surrounding four sidewalls of the concave at the capacitor region according to FIG. 12B.
Figure 14B:
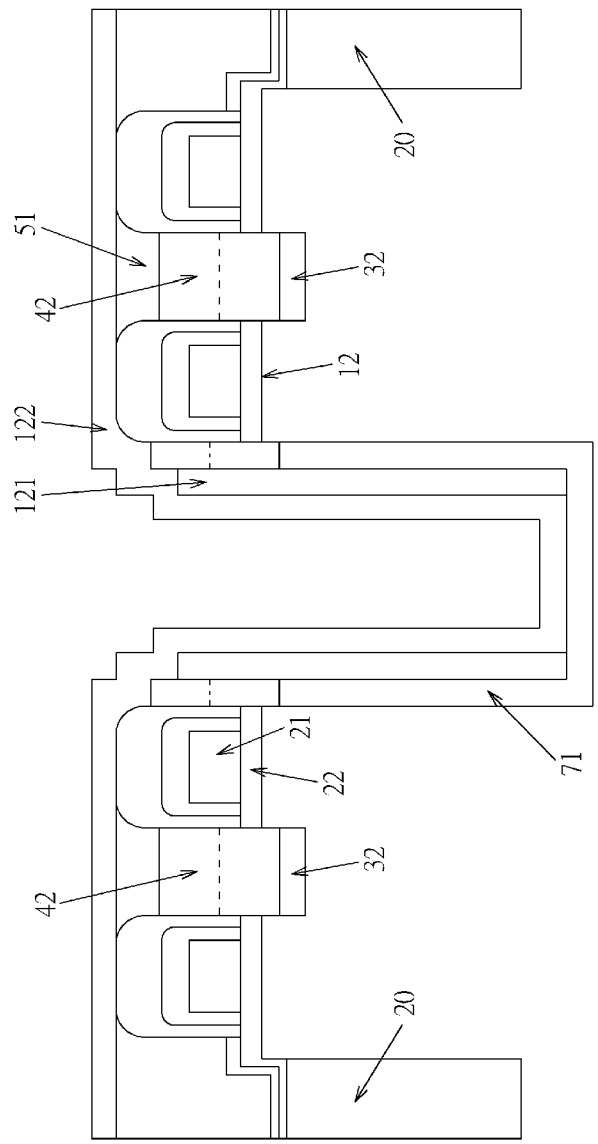
FIG. 14B illustrates a cross-section view following a forming step for a metal layer having a connection on the top exposed VTS area according to FIG. 13B.

2. Alternatively, a nitride-6 layer ("covering isolator") 121 could be deposited with well-controlled thickness to wrap the VTS source pillar 92 and the oxide-8 layer 71 as shown in FIG. 12B. Then use etch back method to leave the nitride-6 layer 121 surrounding the four sidewalls of the concave-2 region 61 with an exposed top portion of the VTS source pillar 92 as shown in FIG. 13B. Moreover, deposit a metal layer 122 (or another choice of a conductive material such as n+ doped polysilicon layer or silicide layer or the like) so that this metal layer 122 has a connection on the top exposed VTS source pillar 92 but is fully isolated from the outside silicon substrate of the concave-2 region 61 by oxide-8 layer 71 (FIG. 14B). As compared with FIG. 14B, the metal layer in FIG. 14A has few zigzag to wrap over the top exposed surface of the VTS source pillar 92 and smoothly over the oxide-8 layer 71/oxide-9 layer 123.

Figure 15:
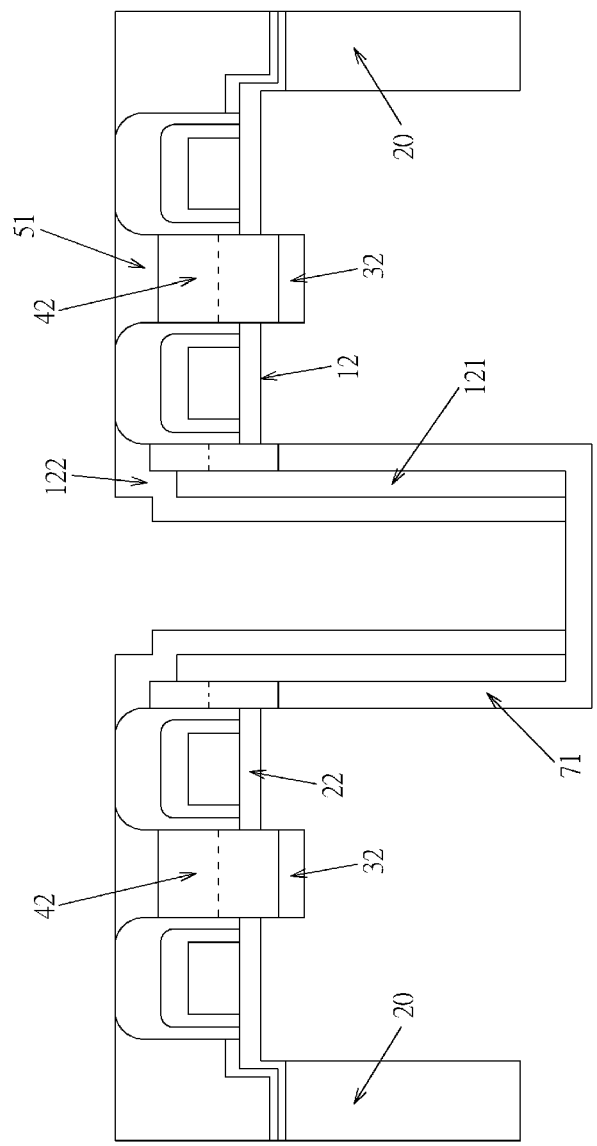
FIG. 15 illustrates a cross-section view following a metal etch back step for forming four pillars on sidewalls but no connection of these pillars at the bottom of the concave at the capacitor region.
Figure 16:
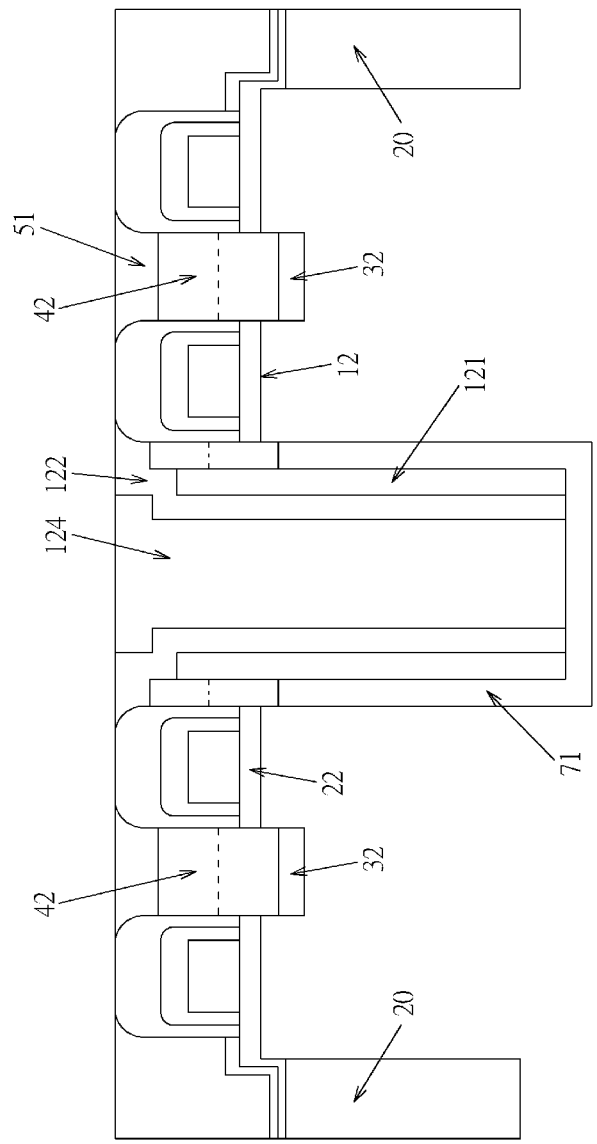
FIG. 16 illustrates a cross-section view following a forming step for filling SOG material in the concave at the capacitor region.

(j) The following FIGS. 15 to 20 will based on the structure in FIG. 14B. Use etch back technique to remove the metal layer 122 on top of the reference surface 52 and remove the metal layer 122 on the bottom surface of the concave-2 region 61, that is, to achieve breaking up the top collar-ring so that only four pillars on sidewalls but no connection of these pillars at the bottom are achieved (FIG. 15). Then deposit a thick layer of SOG material 124 (or any appropriate filler material like amorphous or polysilicon or the like) and use an etch back process technique to have a flat surface on the top (FIG. 16).

Figure 17:
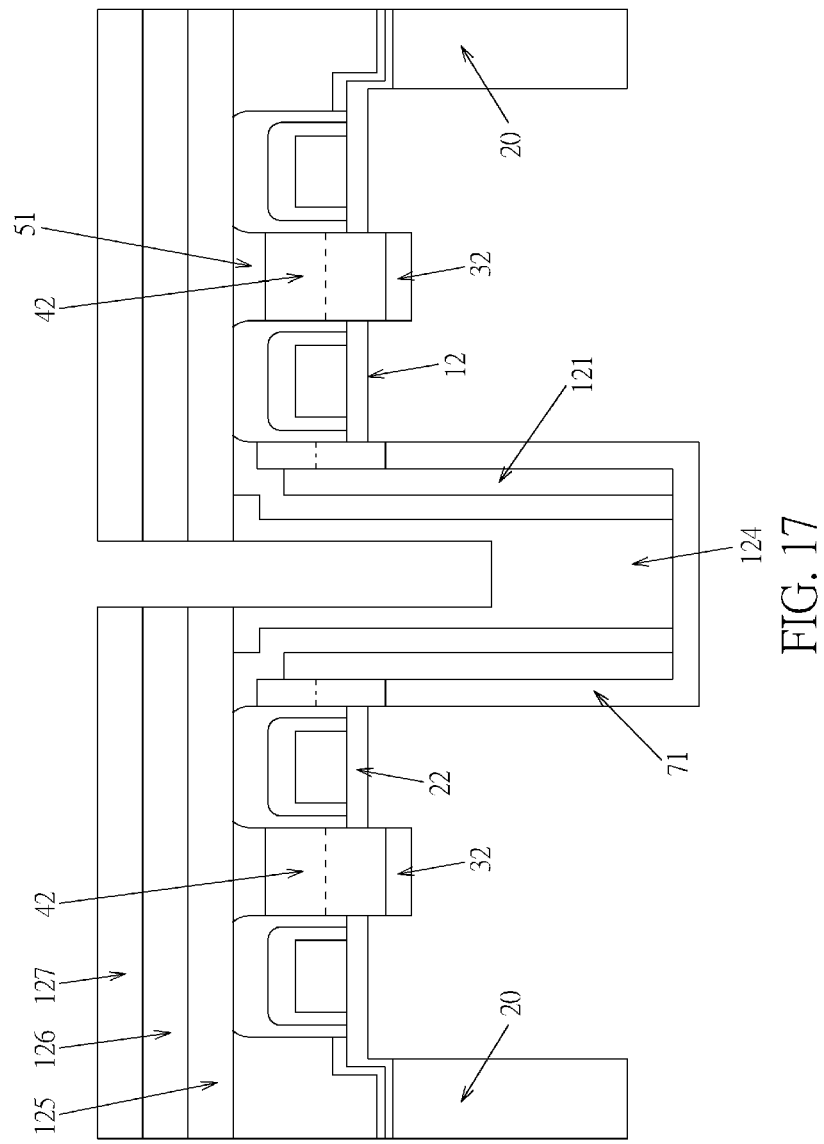
FIG. 17 illustrates a cross-section view following an etching step for removing upper portion of the SOG filler for subsequent formation of a counter-electrode plate region.
Figure 18:
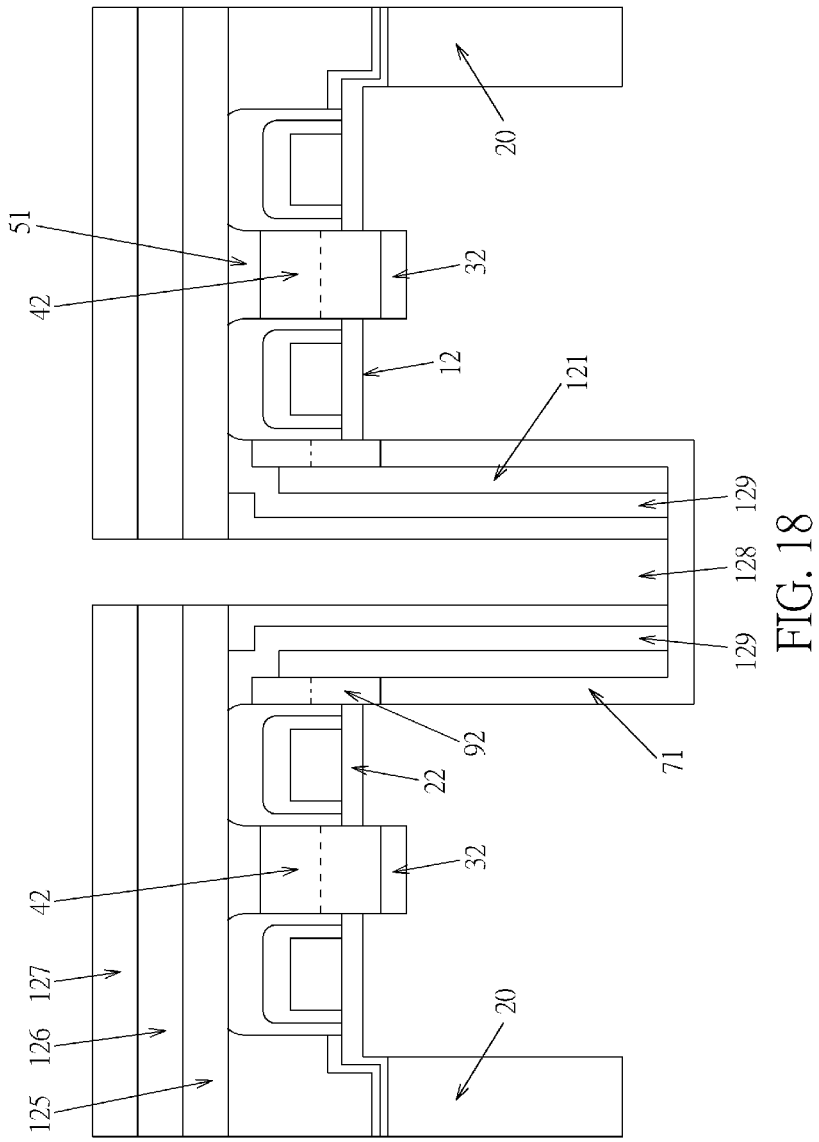
FIG. 18 illustrates a cross-section view following a more complete etching step for the well-defined counter-electrode plate region.

(k) Deposit an oxide-9 layer 125 and a nitride-7 layer 126. Use a photolithography technique to make a photoresist 127 patterning to create a counter-electrode plate region vertically cutting through the concave-2 region 61. Since the concave-2 region 61 is deep, the final cut-through process will be carried on step by step (FIG. 17 shows that the upper portion of the SOG filler has been removed). Then more complete etching is continued until the counter-electrode plate region 128 is well defined as shown in FIG. 18. This counter-electrode formation also breaks up both the ring structures of the VTS source pillar 92 and the metal-electrode pillars 129 so that the individual signal-storage electrode pillar 129 is isolated and stands against the counter-electrode plate with the high-k dielectric layer in between.

Figure 19:
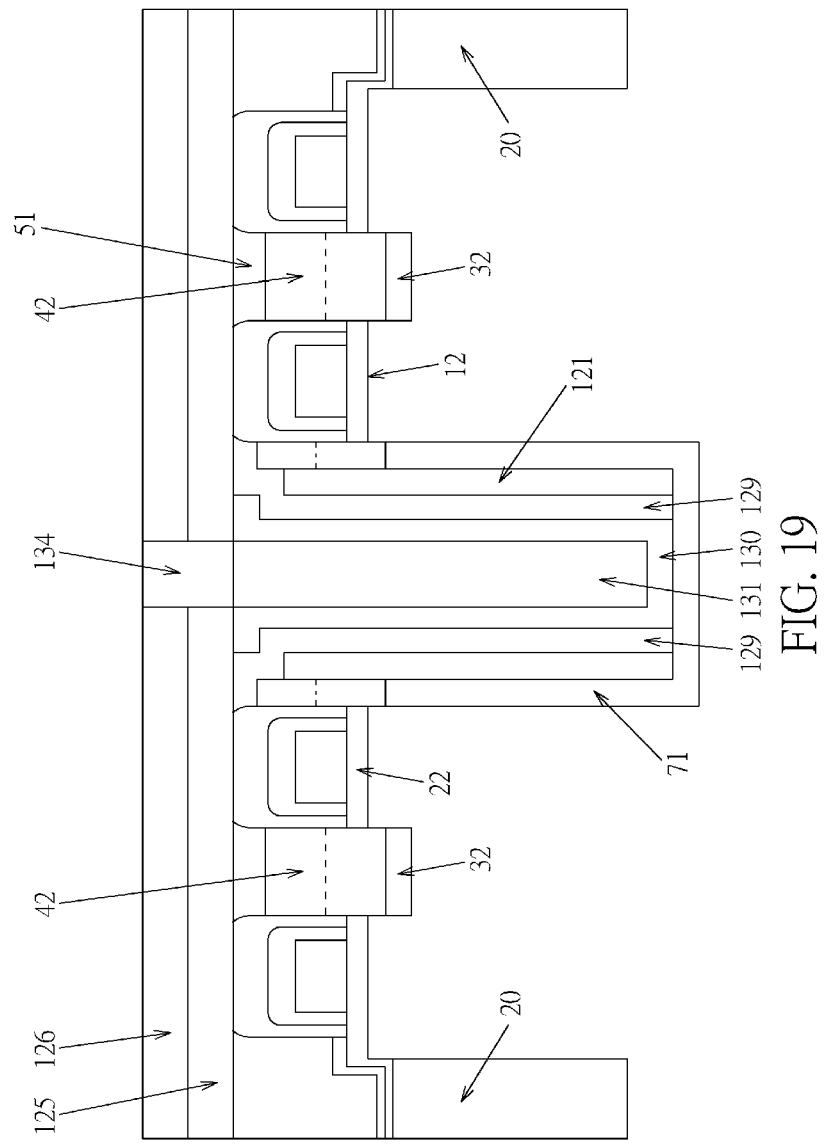
FIG. 19 illustrates a cross-section view following a forming step for filling a high-k dielectric insulator after removing the SOG filler in the concave at the capacitor region.

(l) Remove the SOG layer and form the high-k dielectric insulating layer 130 for the capacitor surrounding the metal electrode pillars 129, and then deposit the metal material (or any other conductive material such as n+ doped polysilicon or amorphous-silicon or silicide or the like) to fill the central vacancy which has already been formed as the location of the counter-electrode plate 131. The top of the counter-electrode plate 131 could be aligned with the top of the high-k dielectric insulating layer 130 and the top of the metal-electrode pillars 129, and an additional oxide layer 134 could be positioned on the top of the counter-electrode plate 131 (FIG. 19).

Figure 20:
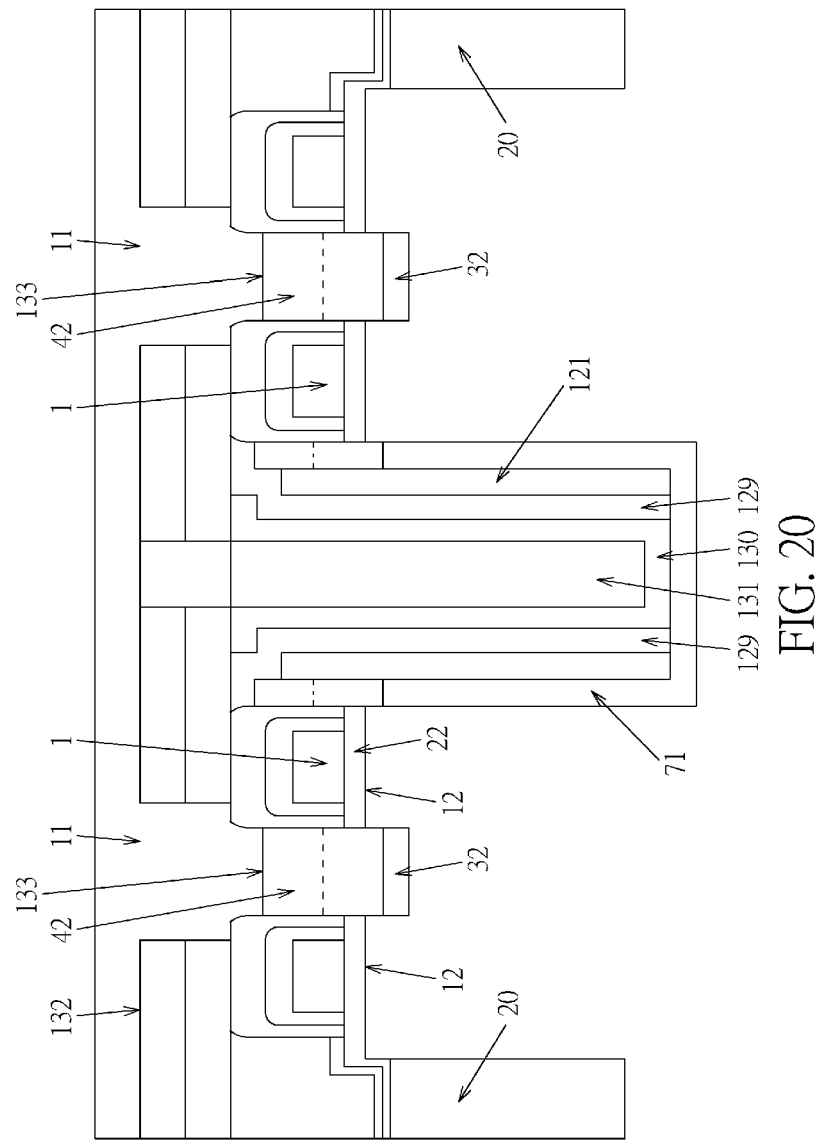
FIG. 20 illustrates a cross-section view following a forming step for metal interconnections.

(m) FIG. 20 shows that a second reference surface 132 has been created. If the surfaces 133 of the VTD drain regions 42 are used as a level reference to be widely opened, then the metal interconnections such as the bit-lines 11 connecting the DRAM cells can be much more easily achieved since the surface topography is much more smooth than the previous attempts of drilling holes to connect the bit-lines 11 on the top of the second reference surface 132 to the original silicon surface 12. As a result, a smaller metal pitch of bit-lines 11 can be accomplished to connect the individual cell's drain region 42. Both connections of further metal lines to connect gate 1 and counter-electrode-plate 131 suffer much fewer topographical issues than before.

Figure 21A:
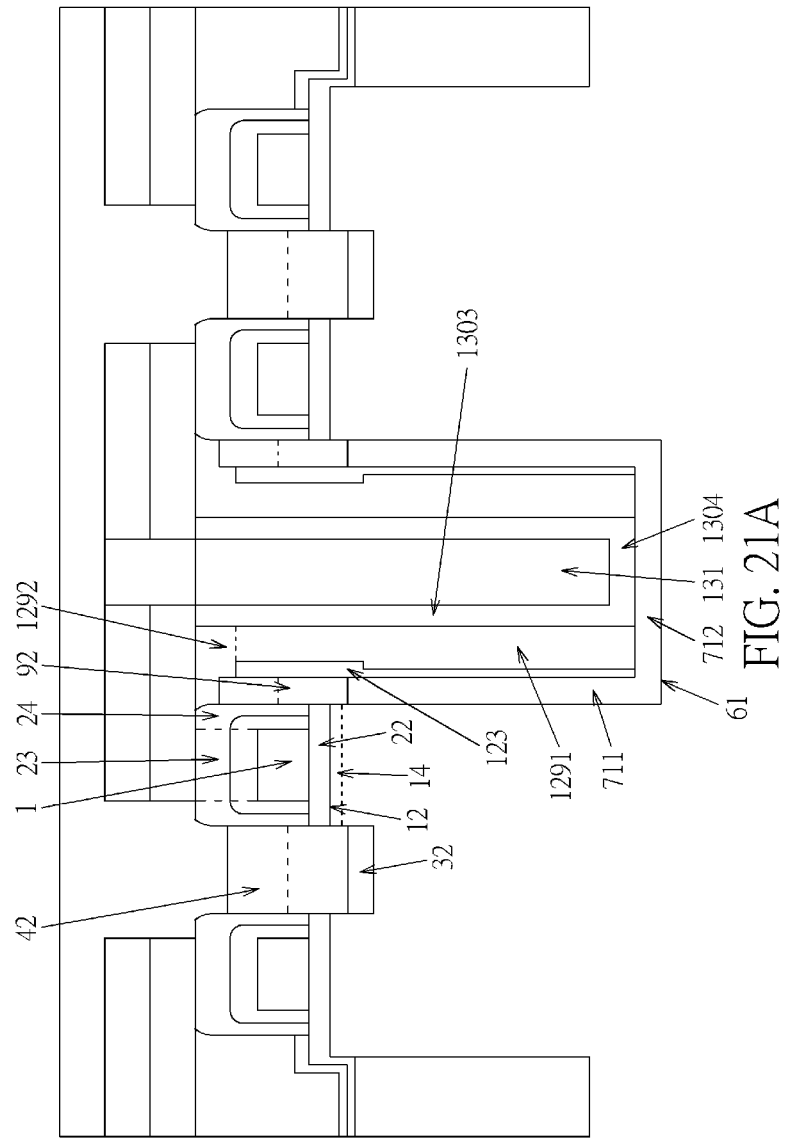
FIG. 21A illustrates a cross-section view of the DRAM cell structure in FIG. 1A with additional description for most components thereof.

FIG. 21A corresponds to FIG. 1A but has additional descriptions for most components of the DRAM cell in FIG. 1A. This proposed WU cell includes an asymmetric transistor coupled to a capacitor. The asymmetric transistor includes a drain region 42 (or the first conductive region) extending upward from an isolator region 32. It could also be described that the drain region 42 extends downward from a silicon surface 12 to the isolator region 32 and upward from the silicon surface 12 to a top surface thereof which could be higher than the top of the gate 1. The gate 1 is positioned above the silicon surface 12 and extends upward from the gate dielectric 22. The source region 92 (or the second conductive region) of asymmetric transistor extends upward from a first portion 711 of the isolating layer 71. It could also be described that the source region 92 extends downward from the silicon surface 12 to the first portion 711 of the isolating layer 71 and upward from the silicon surface 12 to a top surface thereof which could be higher than the top of the gate 1. The channel region 14 is under the gate region 1 and contacts the source region 92 and the drain region 42. Furthermore, the upward extending directions of the drain region 42, the gate region 1, and the source region 92 are perpendicular or substantially perpendicular to the silicon surface 12. Moreover, a spacer 24 is disposed above the silicon surface 12 and covers at least two sidewalls of the gate region 1, wherein the drain region 42 and the source region 92 contact the spacer 24. The silicon surface could be the silicon substrate surface when the transistor is a planar transistor, or could be the top surface of the fin structure when the transistor is a fin structure transistor, such as FinFET or tri-gate transistor.

Additionally, in the asymmetric transistor, the shape or size of the drain region 42 could be different from that of the source region 92. In one embodiment, the drain region 42 (or the source region 92) includes a lower portion and an upper portion vertically stacked above the lower portion, and the lower portion contacts with the channel region 14. Furthermore, the doping concentration profile of the drain/source region is controllable, for example, the doping concentration profile from the bottom to the top of the drain/source region could include: (1) a lightly doped zone, a normal doped zone, a greater doped zone and a heavily doped zone; (2) a normal doped zone, a lightly doped zone, a greater doped zone, and a heavily doped zone; or (3) an un-doped zone, a normal doped zone, a greater doped zone and a heavily doped zone. Wherein, the concentration of the heavily doped zone is greater than that of the greater doped zone, the concentration of the greater doped zone is greater than that of the normal doped zone, the concentration of the normal doped zone is greater than that of the lightly doped zone, and the concentration of the lightly doped zone is greater than that of the un-doped zone.

The capacitor is partially formed in a concave 61 and the isolating layer 71 is positioned in the concave, wherein the first portion 711 of the isolating layer 71 covers the sidewall of the concave 61 and a second portion 712 of the isolating layer 71 covers the bottom wall of the concave 61. Moreover, the capacitor extends upward from the second portion 712 of the isolating layer 711. It could also be described that the capacitor extends downward from the silicon surface 12 to the second portion 712 of the isolating layer 71 and upward from the silicon surface 12 to a third top surface which could be higher than the top of the gate 1. The capacitor includes a capacitor electrode 129 (or the first electrode) which comprises a connecting portion 1292 and an upright portion 1291. The connecting portion 1292 contacts the source region 92 and the upright portion 1291 extends upward from the second portion 712 of the isolating layer 71. The capacitor also includes an insulating layer 130 which comprises a third portion 1303 and a fourth portion 1304. The third portion 1303 of the insulating layer 130 extends upward from the second portion 712 of the isolating layer 71. The fourth portion 1304 of the insulating layer 130 covers the second portion 712 of the isolating layer 71. The capacitor further includes a counter electrode 131 (or the second electrode) extending upward from the fourth portion 1304 of the insulating layer 130. Wherein the upward extending directions of the upright portion 1291 of the capacitor electrode 129, the third portion 1303 of the insulating layer 130 and the counter electrode 131 are perpendicular or substantially perpendicular to the silicon surface 12. Moreover, the top surfaces of the third portion 1303 of the insulating layer 130, the connecting portion 1292 of the capacitor electrode 129, and the counter electrode 131 are not lower than the top surface of the gate region 1.

The DRAM cell further comprises a covering isolator 123 between the upright portion 1291 of the first electrode 129 and the first portion 711 of the isolating layer 71, wherein the top surface of the covering isolator 123 is not higher than the top surface of the source region 92 to reveal a portion of the source region 92. The connecting portion 1292 of the capacitor electrode 129 covers the revealed portion of the source region 92. The position of the top surface of the covering isolator 123 is adjustable.

In such DRAM cell, it could be that the top surfaces of the third portion 1303 of the insulating layer 130, the connecting portion 1292 of the capacitor electrode 129, and the counter electrode 131 are aligned. There is a cap structure 23 above the gate region 1, and the top surface of the cap structure 23 is aligned with those of the third portion 1303 of the insulating layer 130, the connecting portion 1292 of the capacitor electrode 129, and the counter electrode 131.

FIG. 21B corresponds to FIG. 1B but has additional descriptions for most components of the DRAM cell in FIG. 1B. Moreover, FIG. 21B is almost the same as FIG. 21B, except at least that the capacitor also includes an insulating layer 130 which comprises a third portion 1303, a fourth portion 1304, and a fifth portion 1305. The third portion 1303 of the insulating layer 130 extends upward from the second portion 712 of the isolating layer 71. The fourth portion 1304 of the insulating layer 130 covers the second portion 712 of the isolating layer 71. The fifth portion 1305 of the insulating layer 130 contacts the connecting portion 1292 of the first electrode 129. The capacitor further includes a counter electrode 131 (or the second electrode) extending upward from the fourth portion 1304 of the insulating layer 130. Wherein the upward extending directions of the upright portion 1291 of the capacitor electrode 129, the third portion 1303 of the insulating layer 130 and the counter electrode 131 are perpendicular or substantially perpendicular to the silicon surface 12. Moreover, the top surfaces of the fifth portion 1305 of the insulating layer 130, the connecting portion 1292 of the capacitor electrode 129, and the counter electrode 131 are not lower than the top surface of the gate region 1.

The covering isolator in FIG. 21B is marked by number 121, and this covering isolator 121 is between the upright portion 1291 of the first electrode 129 and the first portion 711 of the isolating layer 71, wherein the top surface of the covering isolator 121 is lower than that of the source region 92 to reveal a portion of the source region 92. The connecting portion 1292 of the capacitor electrode 129 covers the revealed portion of the source region 92, and could also covers the top surface of the covering isolator 121. In such DRAM cell, it could be that the top surfaces of the fifth portion 1305 of the insulating layer 130, the connecting portion 1292 of the capacitor electrode 129, and the counter electrode 131 are aligned. There is a cap structure 23 above the gate region 1, and the top surface of the cap structure 23 is aligned with those of the fifth portion 1305 of the insulating layer 130, the connecting portion 1292 of the capacitor electrode 129, and the counter electrode 131.

As a result, the total size of the WU cell can be squeezed due to such a unique structure innovation, and the cell size is especially compacted by multiple self-alignment techniques. With the examples and explanations mentioned above, the features and spirits of the invention are hopefully well described.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A DRAM cell structure comprising:
a transistor comprising:
   a first conductive region extending upward and downward from a silicon surface;
   a gate region above the silicon surface and extending upward from a gate dielectric layer;
   a second conductive region extending upward and downward from the silicon surface; and
   a channel region being under the gate region and contacting the first conductive region and the second conductive region;
   wherein the upward extending directions of the first conductive region, the gate region, and the second conductive region are perpendicular or substantially perpendicular to the silicon surface;
a concave formed below the silicon surface;
an isolating layer positioned in the concave, wherein the isolating layer comprises a first portion covering a first sidewall of the concave and extending upward from a bottom wall of the concave, and a second portion covering a bottom surface of the concave; and
a capacitor coupled to the transistor, wherein the capacitor extends upward from the second portion of the isolating layer to a predetermined position higher than the silicon surface, the capacitor comprising:
   a first electrode comprising a connecting portion contacting with the second conductive region and an upright portion extending upward from the second portion of the isolating layer;
   an insulating layer comprising a third portion extending upward from the second portion of the isolating layer and a fourth portion covering the second portion of the isolating layer; and
   a second electrode extending upward from the fourth portion of the insulating layer; and
   wherein the insulating layer is positioned between the first and the second electrodes, and upward extending directions of the upright portion of the first electrode, the third portion of the insulating layer, and the second electrode are perpendicular or substantially perpendicular to the silicon surface;
a covering isolator between the upright portion of the first electrode and the first portion of the isolating layer, wherein the covering isolator covers a first portion of the second conductive region, and the connecting portion of the first electrode covers a second portion of the second conductive region.

2. The DRAM cell structure in claim 1, the insulating layer further comprising a fifth portion contacting the connecting portion of the first electrode, wherein top surfaces of the fifth portion of the insulating layer, the connecting portion of the first electrode, and the second electrode are not lower than a top surface of the gate region.

3. The DRAM cell structure in claim 2, wherein the top surfaces of the fifth portion of the insulating layer, the connecting portion of the first electrode, and the second electrode are aligned.

4. The DRAM cell structure in claim 1, wherein the top surfaces of the first conductive region and the second conductive region are lower or not lower than the top surface of the gate region.

5. The DRAM cell structure in claim 4, wherein the top surfaces of the first conductive region and the second conductive region are aligned.

6. A DRAM cell structure comprising:
a concave formed below a silicon surface;
a transistor, comprising:
   a first conductive region extending upward and downward from the silicon surface;
   a gate region above the silicon surface and extending upward from a gate dielectric layer;
   a second conductive region extending upward and downward from the silicon surface; and
   a channel region being under the gate region and contacting the first conductive region and the second conductive region;
   wherein the upward extending directions of the first conductive region, the gate region, and the second conductive region are perpendicular or substantially perpendicular to the silicon surface; an isolating layer positioned in the concave, wherein the isolating layer comprises a first portion covering a first sidewall of the concave and extending upward from a bottom wall of the concave, and a second portion covering a bottom surface of the concave; and
a capacitor coupled to the transistor, wherein the capacitor extends upward from the second portion of the isolating layer to a predetermined position higher than the silicon surface;
wherein a top surface of the first conductive region is higher than the silicon surface, and the first conductive region extends downward from the silicon surface to a first isolator region.

7. The DRAM cell structure in claim 6, wherein the first conductive region includes a lower portion and an upper portion vertically stacked above the lower portion, and the lower portion contacts with the channel region and the first isolator region.

8. The DRAM cell structure in claim 6, wherein the top surface of the second conductive region is higher than the silicon surface, and the second conductive region extends upward from the first portion of the isolating layer to the top surface of the second conductive region.

9. The DRAM cell structure in claim 8, wherein the second conductive region includes a lower portion and an upper portion vertically stacked above the lower portion, and the lower portion contacts the channel region and the first portion of the isolating layer.

10. The DRAM cell structure in claim 6, wherein the shape or size of the first conductive region is different from that of the second conductive region.

11. The DRAM cell structure in claim 6, further comprising a spacer being above the silicon surface and covering at least two sidewalls of the gate region, wherein the first conductive region and the second conductive region contact with the spacer.

12. A DRAM cell structure comprising:
a concave formed below a silicon surface;
a transistor, comprising:
   a first conductive region extending upward and downward from the silicon surface;
   a gate region above a the silicon surface and extending upward from a gate dielectric layer;
   a second conductive region extending upward and downward from the silicon surface; and
   a channel region being under the gate region and contacting the first conductive region and the second conductive region;
   wherein the upward extending directions of the first conductive region, the gate region, and the second conductive region are perpendicular or substantially perpendicular to the silicon surface;

an isolating layer positioned in the concave, wherein the isolating layer comprises a first portion covering a first sidewall of the concave and extending upward from a bottom wall of the concave, and a second portion covering a bottom surface of the concave;

a capacitor coupled to the transistor, wherein the capacitor extends upward from the second portion of the isolating layer to a predetermined position higher than the silicon surface; and a covering isolator derived from a lower portion of the second conductive region and from the first portion of the isolating layer.

13. The DRAM cell structure in claim 12, the covering isolator comprises oxide material, the isolating layer comprises oxide material, and the second conductive region comprises silicon material.

14. A DRAM cell structure comprising:
a first concave and a second concave formed below a silicon surface;
an isolating layer positioned in the second concave, wherein the isolating layer comprises a first portion covering a first sidewall of the second concave and a second portion covering a bottom surface of the second concave;
a capacitor partially formed in the second concave and extending upward from the second portion of the isolating layer; and
a transistor comprising:
a drain region extending upward from an isolator region which is positioned in the first concave;
a gate region above the silicon surface and extending upward from a gate dielectric layer;
a source region partially formed in the second concave and extending upward from the first portion of the isolating layer; and
a channel region being under the gate region and contacting the drain region and the source conductive region;
wherein top surfaces of the drain region, the source region and the capacitor are higher than the silicon surface.

15. The DRAM cell structure in claim 14, wherein the top surfaces of the drain region, the source region and the capacitor are higher than that of the gate region.

16. The DRAM cell structure in claim 14, wherein the top surfaces of the isolator region and the first portion of the isolating layer are lower than the silicon surface.

17. The DRAM cell structure in claim 14, wherein a second transistor adjacent to the DRAM cell shares the drain region with the transistor of the DRAM cell.

18. The DRAM cell structure in claim 14, the capacitor comprising:
a first electrode comprising a connecting portion contacting with the source region and an upright portion extending upward from the second portion of the isolating layer;
an insulating layer comprising a third portion extending upward from the second portion of the isolating layer, a fourth portion covering the second portion of the isolating layer and a fifth portion contacting the connecting portion of the first electrode; and
a second electrode extending upward from the fourth portion of the insulating layer;
wherein top surfaces of the fifth portion of the insulating layer, the connecting portion of the first electrode, and the second electrode are not lower than the top surface of the gate structure.

19. The DRAM cell structure in claim 18, further comprising a cap structure above the gate region, and the top surface of the cap structure is aligned with the top surfaces of the fifth portion of the insulating layer, the connecting portion of the first electrode, and the second electrode.

20. The DRAM cell structure in claim 18, wherein a second DRAM cell adjacent to the DRAM cell comprises a second capacitor which shares the second electrode with the capacitor of the DRAM cell.

21. A DRAM cell structure comprising:
a first concave and a second concave formed below a silicon surface;
an isolating layer positioned in the second concave;
a capacitor partially formed in the second concave; and
a transistor comprising:
a drain region partially formed in the first concave;
a gate region above the silicon surface and extending upward from a gate dielectric layer; and
a source region partially formed in the second concave;
wherein top surfaces of the drain region, the source region and the capacitor are higher than the silicon surface.

22. The DRAM cell structure in claim 21, wherein a second transistor adjacent to the DRAM cell shares the drain region with the transistor of the DRAM cell.

23. The DRAM cell structure in claim 21, the capacitor comprising:
a first electrode comprising a connecting portion contacting with the source region and an upright portion extending upward from the isolating layer;
an insulating layer; and
a second electrode extending upward from the insulating layer;
wherein a second DRAM cell adjacent to the DRAM cell comprises a second capacitor which shares the second electrode with the capacitor of the DRAM cell.

24. The DRAM cell structure in claim 21, wherein the drain region or the source region comprises a silicon containing material.

25. The DRAM cell structure in claim 21, further comprising a spacer being above the silicon surface and covering at least two sidewalls of the gate region, wherein the spacer comprises a nitride layer, an oxide layer, a low dielectric constant material, or any combination thereof.

* * * * *